(12) United States Patent
Boudiaf et al.

(10) Patent No.: US 6,853,198 B2
(45) Date of Patent: Feb. 8, 2005

(54) METHOD AND APPARATUS FOR PERFORMING MULTIPORT THROUGH-REFLECT-LINE CALIBRATION AND MEASUREMENT

(75) Inventors: Ali Boudiaf, Malden, MA (US); Vahe Adamian, Lexington, MA (US); Peter Phillips, Leominster, MA (US)

(73) Assignee: Agilent Technologies, Inc., Palo Alto, CA (US)

( * ) Notice: Subject to any disclaimer, the term of this patent is extended or adjusted under 35 U.S.C. 154(b) by 135 days.

(21) Appl. No.: 10/294,317

(22) Filed: Nov. 14, 2002

(65) Prior Publication Data

US 2004/0095145 A1 May 20, 2004

(51) Int. Cl.[7] .......................... G01R 35/00; G01R 27/04
(52) U.S. Cl. ....................................... 324/601; 324/638
(58) Field of Search ............................... 324/601–604, 324/618, 638

(56) References Cited

U.S. PATENT DOCUMENTS

| | | | |
|---|---|---|---|
| 5,434,511 A | | 7/1995 | Adamian et al. |
| 5,467,021 A | | 11/1995 | Adamian et al. |
| 5,548,221 A | | 8/1996 | Adamian et al. |
| 5,578,932 A | | 11/1996 | Adamian |
| 5,793,213 A | | 8/1998 | Bockelman et al. |
| 5,825,669 A | | 10/1998 | Oldfield et al. |
| 6,188,968 B1 | * | 2/2001 | Blackham ..................... 702/85 |
| 6,300,775 B1 | | 10/2001 | Peach et al. |
| 6,421,624 B1 | * | 7/2002 | Nakayama et al. ......... 702/117 |
| 6,614,237 B2 | * | 9/2003 | Ademian et al. ............ 324/601 |
| 6,744,262 B2 | * | 6/2004 | Adamian ..................... 324/638 |
| 6,757,625 B2 | * | 6/2004 | Adamian et al. ............. 702/57 |
| 2003/0173978 A1 | * | 9/2003 | Adamian et al. ........... 324/638 |

FOREIGN PATENT DOCUMENTS

| | | |
|---|---|---|
| DE | 19736897 A1 | 4/1998 |
| DE | 19755659 A1 | 6/1999 |

OTHER PUBLICATIONS

Rytting, Network Analyzer Error Models and Calibration Methods, Public. date unknown.

Rytting, Advances in Microwave Error Correction Techniques, RF & Microwave Measurement SY mposium and Exhibition, Jun. 1987.

Ferrero et al., "Accurate Coaxial Standard Verification by Multiport Vector Network Analyzer", 1994.

(List continued on next page.)

*Primary Examiner*—Jay Patidar
*Assistant Examiner*—Jeff Natalini
(74) *Attorney, Agent, or Firm*—June L. Bouscaren

(57) ABSTRACT

A method and apparatus for calibrating a measurement path of 2N measurement ports comprises presenting a high reflect calibration standard at each measurement port and measuring a reflection characteristic for each measurement port, presenting a line calibration standard and a through calibration standard between each one of N direct pairs of the measurement ports and measuring forward and reverse reflection and transmission responses and calculating a load match error coefficient for each measurement port, and presenting only the through calibration standard between indirect pairs of measurement ports and calculating the forward and reverse transmission tracking for each indirect pairs of measurement ports.

23 Claims, 26 Drawing Sheets

OTHER PUBLICATIONS

Ferrero et al., "A New Implementation of a Multiport Automatic Network Analyzer", 1992.

Ferrero et al., "Multiport Vector Network Analyzer Calibration: A General Formulation", 1994.

Marks, "A Multipline Method of Network Analyzer Calibration", 1991.

Ferrero, "Two•Port Network Analyzer Calibratin Using an Unknown Thru", IEEE Microwave and Guided Wave Letters, vol. 2, No. 12, Dec. 1992, pp. 505–507.

Search Report from German Patent Office issued Oct. 20, 2003, and translation thereof in corresponding German Utility Model 20305 226.9.

* cited by examiner

METHOD AND APPARATUS FOR PERFORMING MULTIPORT THROUGH-REFLECT-LINE CALIBRATION AND MEASUREMENT

BACKGROUND

A vector network analyzer ("VNA") is used to characterize the behavior of an electrical device over a band of frequencies. Because of mismatches and leakage, it is not currently possible to directly measure a device under test ("DUT") at high frequencies without calibration of the VNA. Errors exist in any measurement using a VNA. These measurement errors contribute to the uncertainty of the measurement attributable only to the DUT. By quantifying these measurement errors, their effects can be mathematically removed from the measurement to yield characterization parameters for the device itself. As one of ordinary skill in the art can appreciate, the better the quantification of the measurement errors, the better the ability to remove their effects on the device characterization. Measurement errors in the VNA can be separated into two categories: random errors and systematic errors. Random errors are non-repeatable measurement variations due to noise and temperature changes. Random errors are unpredictable and are difficult to adequately quantify. Systematic errors are repeatable measurement variations in the VNA test-set hardware. Systematic errors are predictable and are possible to quantify and mathematically remove. Systematic errors are the most significant source of VNA measurement uncertainty in the characterization of a device. Therefore, it is beneficial to quantify and remove the systematic errors from the VNA measurements. Conventionally, quantification of the systematic errors is achieved through a VNA calibration. By connecting a number of known calibration artifacts to ports of the VNA, one can measure the calibration artifacts, compare the measured results against known results, and then algorithmically extract systematic error coefficients from the contribution made to the measurement from the known calibration device. Measurements of an unknown device, thereafter, use the systematic error coefficients to mathematically extract the characteristics attributable only to the DUT.

There are a number of calibration procedures available for a 2-port VNA. Calibration methods are named after the group of calibration standards used to extract systematic error coefficients. Some of the more common methods use short, open, load and through calibration standards ("SOLT"), through, reflect, and line calibration standards ("TRL") and a series of electronic loads used as calibration standards ("electronic calibration" or "Ecal").

A preferred method in metrology laboratories is the TRL calibration. It is preferred because it achieves the most accurate assessment of the systematic errors. This is due to the use of an airline standard that can be manufactured very precisely. Additionally, there is no need to know the magnitude of the reflection coefficient of the "reflect" calibration artifact and no need to know the delay of the "line" calibration artifact. Better measurement accuracy in a manufacturing environment provides better feedback in product process control as well as more accurate statistical models for the product cost analysis. Better measurement accuracy in a research and engineering environment provides a more accurate device model permitting simulators to more accurately predict behavior of the product in the context of a circuit.

U.S. patent application Ser. No. 10/098,040 having priority date Sep. 18, 2000 entitled "Method and Apparatus for Linear Characterization of Multiterminal Single-ended or Balanced Devices" (herein "the '040 patent application Ser. No."), and other U.S. Patent Applications claiming priority from the same Provisional Application, disclose a method and apparatus for an SOLT calibration applicable to multiport devices. With specific reference to FIG. 1 of the drawings, there is shown a system block diagram of a 4-port VNA 100 connected to a device under test 101 ("DUT") as described by the '040 Patent Application in which a single reference channel 102 and two test channels, first test channel 111 ("A") and second test channel 112 ("B"), are deployed. The reference channel 102 samples the incident signal, generated by signal generator 105, through a reference channel sampler 110 placed in series between the signal generator 105 and source transfer switch 106. The source transfer switch 106 electrically connects the signal generator 105 to a first signal path 107 or a second signal path 108. The source transfer switch 106 terminates the signal path 107 or 108 that is not connected to the signal generator 105 in a source transfer characteristic impedance 109. A switching network 150 provides for a connection of the first or second test channel 111, 112 to one of 2N measurement ports $103_1$, through $103_{2N}$. The switching network 150 is taught in the '040 Patent Application, the teachings of which are hereby incorporated by reference.

The first and second test channels 111, 112 measure the scattered reflected and transmitted signals from one of the measurement ports 103 connected to the DUT 101 in response to the stimulus from the signal generator 105. The test set-up of FIG. 1 provides for a complete SOLT calibration methodology. There is a need, however, for a more accurate method of device characterization. Under the prior art, the TRL calibration method provides for improved calibration accuracy, but is applicable only to 2 port devices. There is a need, therefore, for a method and apparatus for more accurate calibration and measurement of multiport devices.

SUMMARY

A method of calibrating a measurement path of a vector network analyzer comprises the steps of providing a vector network analyzer having at least two reference receivers, and a total of 2N measurement ports, where N is an integer. A high reflect calibration standard is presented at each measurement port and the VNA measures a reflection characteristic for each measurement port. A line calibration standard is presented between N direct pairs of the measurement ports. The VNA then measures forward and reverse reflection and transmission characteristics for each one of the N direct pairs. A through calibration standard is presented between each one of the N direct pairs and forward and reverse reflection and transmission characteristics for each one of the N pairs is measured. The method then calculates directivity, source match, and reflection tracking error coefficients for each one of the measurement ports.

An apparatus for calibrating a measurement path of a vector network analyzer ("VNA") comprises a vector network analyzer having at least two reference receivers, two test channels, and a total of 2N measurement ports, wherein N is an integer. The system further comprises a means for measuring and storing high reflect characteristics for each measurement port when a high reflect calibration standard is connected thereto, line forward and reverse reflection and transmission characteristics for each one of N direct pairs of the measurement ports when a line calibration standard is connected therebetween, direct through forward and reverse reflection and transmission characteristics for each one of the N direct pairs when a through calibration standard is connected therebetween, and indirect through forward and reverse reflection and transmission characteristics for each one of said N−1 indirect pairs of said measurement ports when said through calibration standard is connected therebetween. The system further comprises a means for calculating directivity, source match, and reflection tracking for each one of the measurement ports based upon the high reflect characteristics, said line forward and reverse reflection and transmission characteristics, and said through forward and reverse reflection and transmission characteristics, load match for each measurement port and forward transmission tracking and reverse transmission tracking for each one of the N direct pairs and N−1 indirect pairs.

DETAILED DESCRIPTION OF INVENTION

Figure 1:
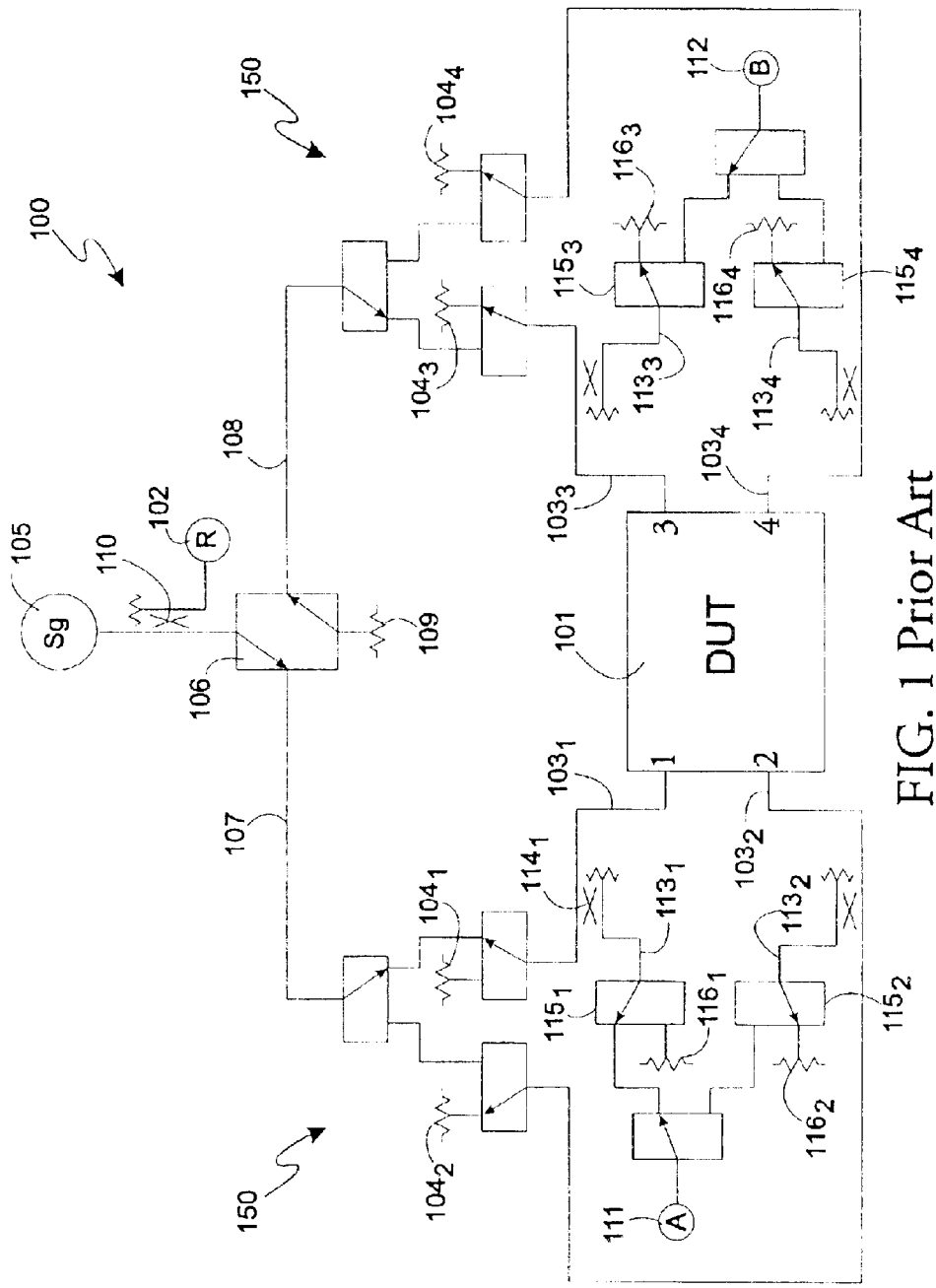
FIG. 1 illustrates a prior art test set-up and VNA.
Figure 2:
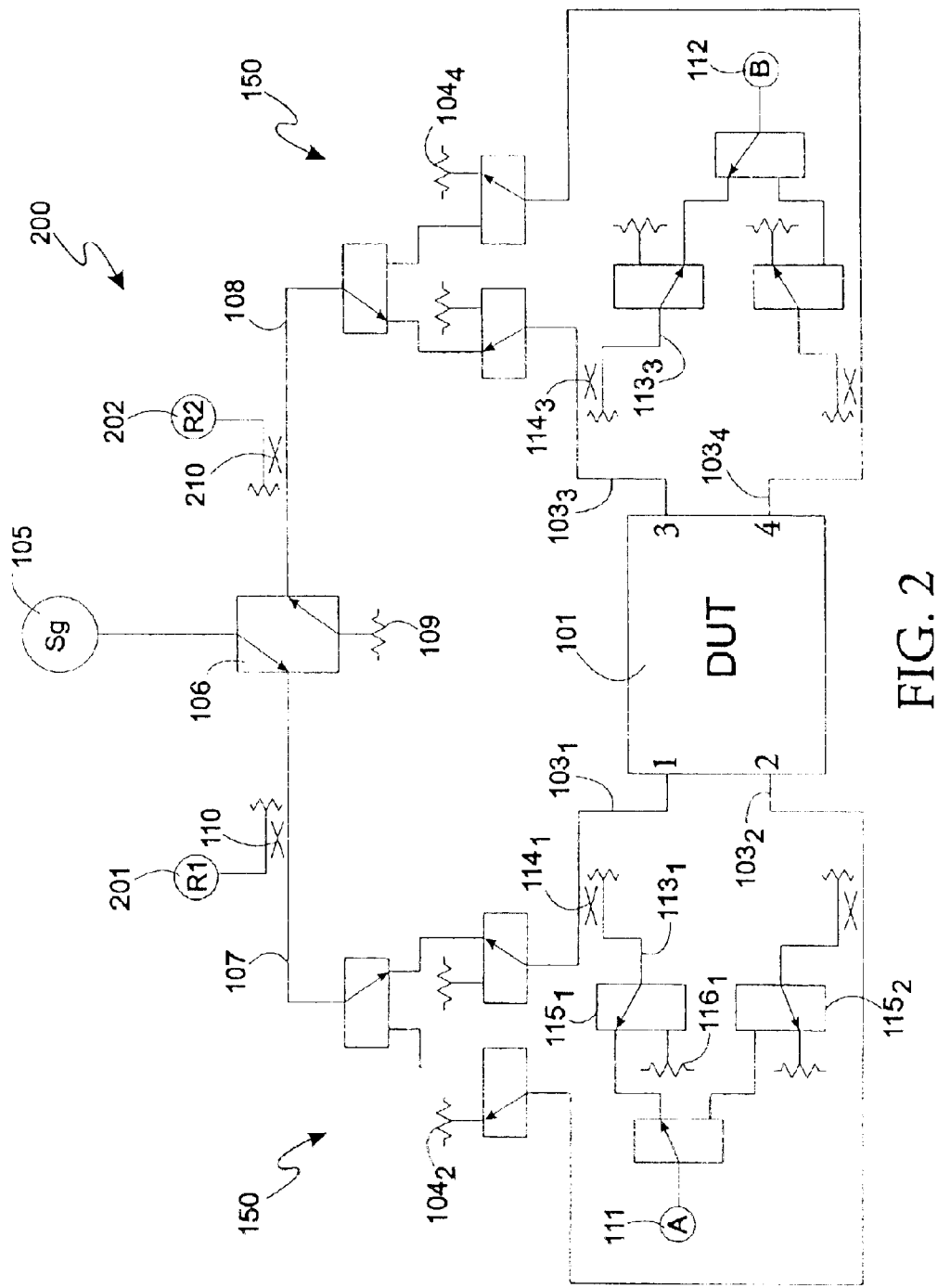
FIG. 2 shows an apparatus according to the teachings of the present invention.

With specific reference to FIG. 2 of the drawings, there is shown a system block diagram of a 4-port VNA 200 that deploys first and second reference channels 201, 202, respectively, and first and second reference channel samplers 110, 210, respectively. In the test set-up shown in FIG. 2, the samplers 110, 210 in a specific example may be bridges or directional couplers. The reference channel samplers 110, 210 are placed in the first and second signal paths 107, 108 on an opposite side of a signal transfer switch 106 from signal generator 105. The samplers 110, 210 extract in one direction a small and predictable portion of the signal present on the first and second signal paths 107, 108 for measurement by the first and second reference channels 201, 202, respectively. The sampled portion is typically −10 dB to −20 dB relative to the signal level on the signal path 107 or 108. The source transfer switch 106 connects either the signal generator 105 to the first signal path 107 and a signal transfer switch terminating load 109 to the second signal path 108 or connects the signal generator 105 to the second signal path 108 and connects the signal transfer switch terminating load 109 to the first signal path 107. In a specific embodiment, there are only two switch positions for the signal transfer switch 106.

A system for measuring a multiple port DUT 101 has as many measurement ports $103_1$ through $103_{2N}$ as there are DUT ports. The illustrative example shown in the drawings includes a 4-port DUT 101 connected to measurement ports $103_1$, $103_2$, $103_3$, and $103_4$. The teachings of the present invention, however, may be applied to a multiport test set-up for measuring DUTs having more than four device connections. A switch network 150 permits connection of each measurement port $103_1$ through $103_{2N}$ to a first or second signal path 107, 108 or to a local terminating impedance, $104_1$ through $104_{2N}$. Certain switch network configurations connect one of the measurement ports 103 to the first signal path 107 or/and a different one of the measurement ports 103 to the second signal path 108 while the remaining paths are terminated in the local terminating impedance 104. The switch network 150 also has sampling arms 113, sampling arms $113_1$ through $113_4$ in the illustrated embodiment. The sampling arms $113_1$ through $113_4$ each comprise a sampler 114 that samples a small and predictable portion of the signal level present at the respective measurement port 103. The sampler 113 may be a coupler or a bridge that takes somewhere between −10 dB and −20 dB of the signal level from the signal level present on the respective measurement port 103. In a specific embodiment according to the present teachings, the portion sampled from the measurement ports 103 is substantially the same portion sampled from the signal paths 107, 108. The sampled signal may then be connected to either a first or second test channel 111, 112 through a respective sampling switch 115 or may be connected to a sampling arm terminating load 116. A switch network 150 of this configuration may connect a reflection path from the measurement ports 103 to one of first and second test channels 111, 112 while terminating the reflection paths from measurement ports 103 not connected to a test channel in a local sampling arm terminating impedance 116.

In a method according to the teachings of the present invention, a TRL calibration on a multi-port DUT having 2N device connections is performed by conducting a conventional 2-port TRL calibration first on each one of N direct pairs of the measurement ports. A user may define the N direct pairs by representing all measurement ports 103 in groupings of two measurement ports 103, where a first port in the direct pair is capable of connection to the first test channel 111 and a second, port in the direct pair is capable of connection to the second test channel 112. As an example, if there are 2N measurement ports, the direct pairs of measurement ports are measurement ports $103_1$ and $103_{N+1}$, measurement ports $103_2$ and $103_{N+2}$, et seq. up to the direct pair of measurement ports $103_N$ and $103_{2N}$ where measurement ports $103_1$ through $103_N$ are capable of connection to the first test channel 111 and measurement ports $103_{N+1}$ through $103_{2N}$ are capable of connection to the second test channel 112.

The method according to the present teachings then performs a through measurement on N−1 indirect pairs of the measurement ports 103 for a 2N port DUT. The N−1 indirect pairs are defined as those groupings of two measurement ports 103 that are not represented in the set of direct pairs of measurement ports where a first measurement port in the indirect pair is capable of connection to the first test channel 111 and the second measurement port in the indirect pair is capable of connection to the second test channel 112. In the illustrated example, there are two direct pairs; first direct pair comprising measurement ports $103_1$ and $103_3$ and second direct pair comprising measurement ports $103_2$ and $103_4$. Also in the specific example, there are two indirect pairs; first indirect pair comprising measurement ports $103_1$ and $103_4$ and second indirect pair comprising measurement ports $103_2$ and $103_3$.

Figure 3:
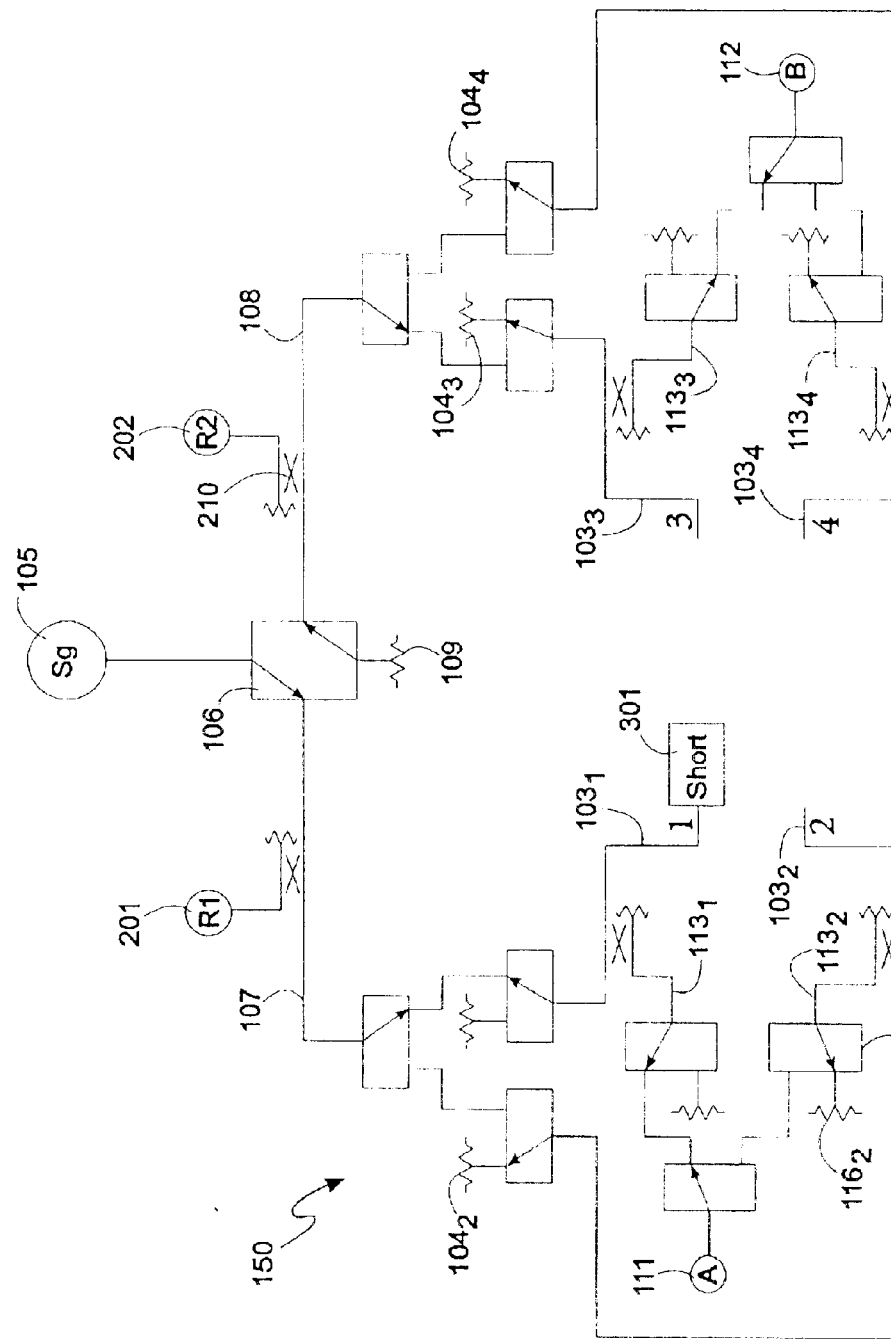
FIGS. 3 through 16 show steps for measuring direct pairs of measurement ports in an embodiment of a method according to the present teachings.

With specific reference to FIG. 3 of the drawings, there is shown a high reflect calibration standard 301 ("the reflect 301") connected to the measurement port 103 of the first direct pair that is capable of connection to the first test channel 111. In the illustrated embodiment, this is measurement port $103_1$. The switching network 150 is then set so the measurement port $103_1$ is connected to the first signal path 107 and the respective sampling arm $113_1$ is connected to the first test channel 111. All remaining unused measurement ports $103_2$, $103_3$ and $103_4$ are terminated in their respective local terminating loads 104 and their respective sampling arms 113 are connected to the sampling arm terminating loads $116_2$, $116_3$, and $116_4$. As one of ordinary skill in the art appreciates, for measurement of the measurement port $103_1$ only the switch network configuration that terminates in a characteristic impedance those measurement ports 103 that are capable of connection to the first test channel 111 are important to the results. Because the isolation of the switches that comprise the switch network 150 is so high, the measurement ports 103 capable of connection to the second test channel 112 do not figure in the high reflect measurement. The reflect 301 may have an unknown magnitude, but its phase characteristics must be known. The signal generator 105 is then swept through a desired frequency range as programmed by an operator and measurements are taken at specific frequencies across the range. During the frequency sweep the VNA 200 measures and stores a ratio of the measured signal level at the first test channel 111 over the measured signal level at the first reference receiver 201. The resulting ratio is a frequency dependant reflection coefficient, herein referred to as a high reflect characteristic for measurement port $103_1$.

$$A_{reflect\_1}/R1_{reflect\_1}$$

Figure 4:
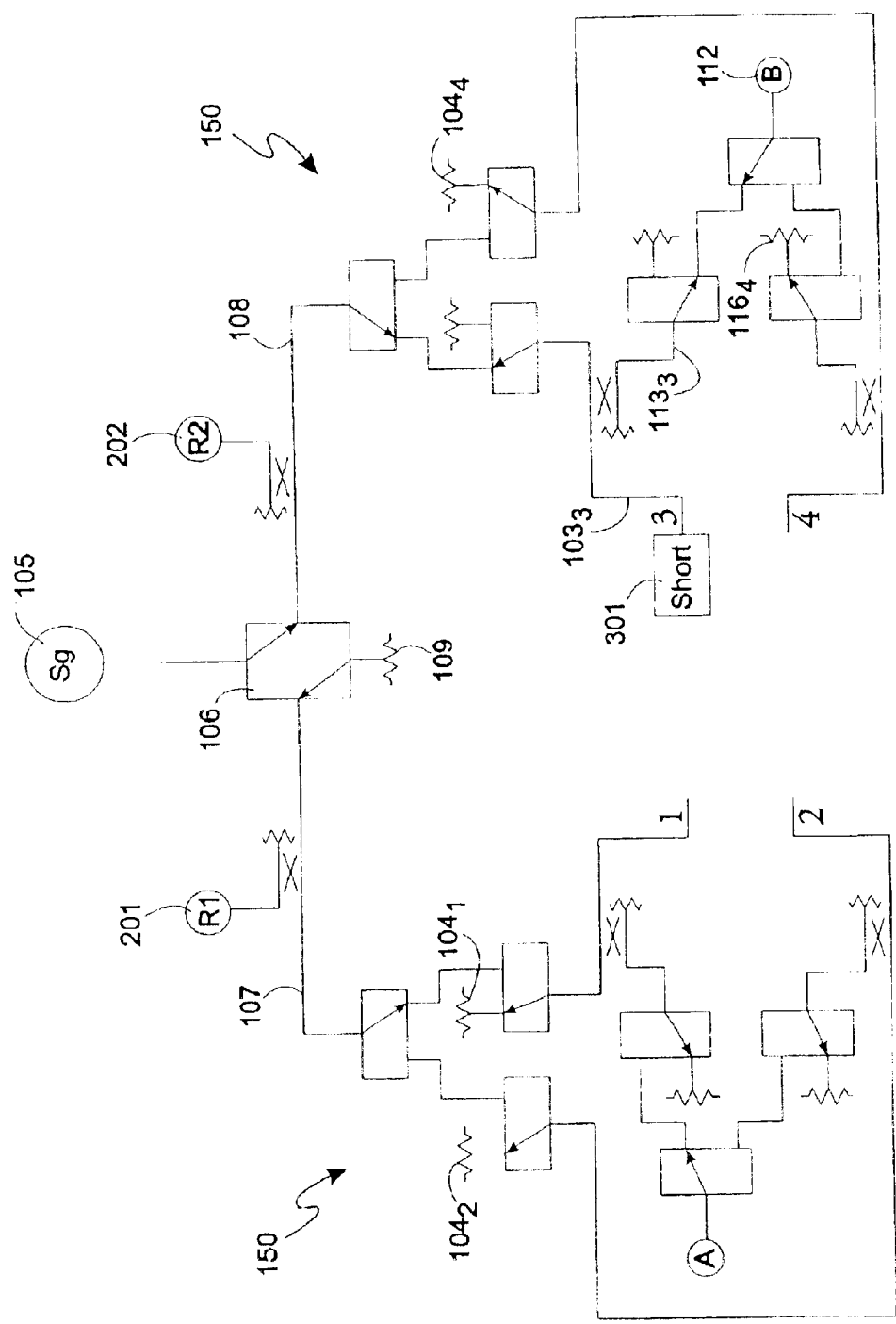

With specific reference to FIG. 4 of the drawings, the same reflect 301 is disconnected from measurement port $103_1$ and is connected to the remaining measurement port in the first direct pair, measurement port $103_3$ in the specific example. The switch network 150 is then configured so that the measurement port $103_3$ is in the second signal path 108, the first signal path 107 is terminated in a characteristic impedance 109, and the sampling arm $113_3$ is connected to the second test port 112. The unused measurement ports 103 capable of connection to the second test port 112, the measurement port $103_4$ in the specific example, are terminated in the local characteristic impedance 104 in the switching network 150. The sampling arms 113 of the unused measurement ports 103 are also terminated in the respective sampling arm terminating loads 116. The signal generator 105 stimulates the second signal path 108 with a signal that is swept over the same desired frequency range as in the reflection measurement of measurement port $103_1$. The VNA 200 measures and stores a measurement of a ratio of the measured signal level at the second test channel 112 over measured signal level of the second signal path 108 as presented to the second reference receiver 202 yielding a frequency dependent array of reflected signal level, herein referred to as a high reflect characteristic for measurement port $103_3$:

$$B_{reflect\_3}/R2_{reflect\_3}$$

Figure 5:
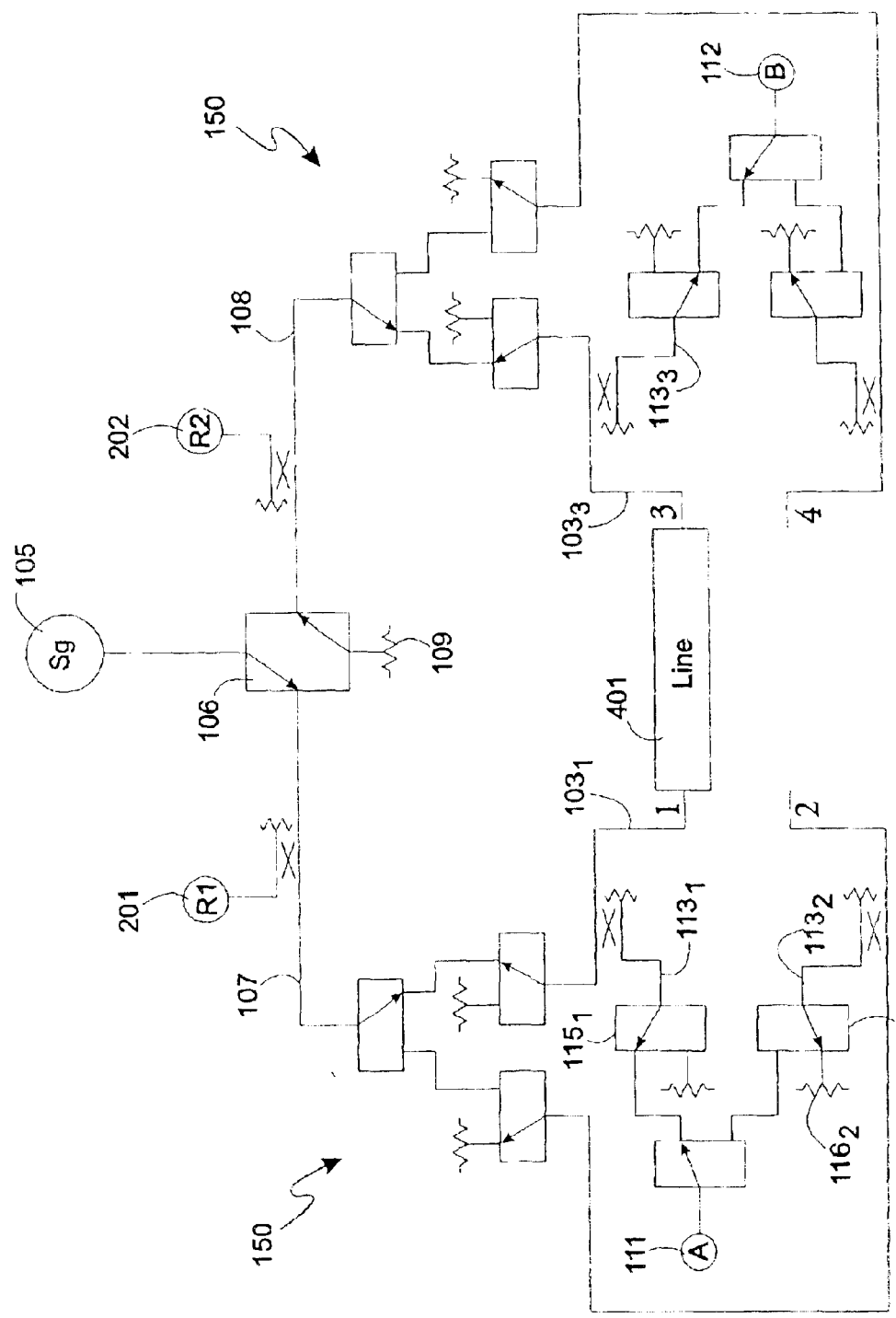

With specific reference to FIG. 5 of the drawings, a next step in the calibration process is to connect a low-loss delay line calibration standard 401 ("the line 401") between the first direct pair, measurement port $103_1$ and measurement port $103_3$ in the illustrated example. In a preferred embodiment, the line 401 is an airline i.e. a delay line having an air dielectric, which is commonly used in metrology laboratories. For on-wafer measurements, a delay line is used. The delay of the line 401 is unknown, but the physical dimensions of the line 401 relate to a range of calibration frequencies. Additional delay line calibration standards can be used to cover a broader frequency range as desired. The delay of the line 401 is defined over a range of frequencies bounded by approximately more than 20 degrees phase shift at a lowest specified frequency and less than 160 degrees phase shift at a highest specified frequency. At frequencies around 500 MHz and below, coaxial airline dimensions become very large and not practical. In this case, and with specific reference to FIG. 6, two high-quality matched loads 501 ("the matched loads 501") are connected to each measurement port 103 of the direct pair. The matched loads 501 are used for calibrating the VNA in a frequency range down to the lowest VNA frequency. The resulting calibration values of the line 401 and the matched loads 501 are different, but the algorithmic formulations using the measured ratios are the same.

With specific reference to FIG. 5 of the drawings in which the line 401 is measured, the transfer switch 106 is set so that the signal generator 105 stimulates the first signal path 107 and the second signal path 108 is terminated at the characteristic impedance 109. The switch network 150 is configured so that the measurement port $103_1$ accepts the stimulus signal from the first signal path 107 and the signal from the sampling arm $113_1$ is presented to the first test port 111. The switch network 150 is further configured so that the measurement port $103_3$ is terminated in the transfer switch characteristic impedance 109 through second signal path 108 and a transmitted signal is presented to the second test port 112 through sampling arm $113_3$. The signal generator 105 sweeps the desired frequency range and the VNA 200 measures signal level from the first and second test channels 111, 112 and the first and second reference receivers 201, 202 and stores the results in a data array. For purposes of clarity and consistency only, when the signal generator 105 is connected to the first signal path 107, all resulting measurements are considered forward direction measurements. Accordingly, the measurements made of the line 401 in the forward direction are represented as the data arrays:

$$A_{f\_line\_13},$$

$$B_{f\_line\_13},$$

$$R1_{f\_line\_13}, \text{ and}$$

$$R2_{f\_line\_13}.$$

where each array comprises a series of measured points at specific frequencies along the desired frequency range.

The transfer switch 106 is then reconfigured (not shown in the drawings) so that the signal generator 105 stimulates the second signal path 108 and the first signal path 107 is terminated in the transfer switch characteristic impedance 109. The configuration of the switch network 150 is not changed from the forward direction measurements. The signal generator 105 again sweeps the desired frequency range and the VNA 200 measures signal level from the first and second test channels 111, 112 and the first and second reference receivers 201, 202 and stores them in data arrays. For purposes of clarity and consistency only, when the signal generator 105 is connected to the second signal path 108, all resulting measurements are considered reverse direction measurements. Accordingly, the measurements made of the line 401 in the reverse direction are represented as the data arrays:

$A_{r\_line\_13}$, $B_{r\_line\_13}$, $R1_{r\_line\_13}$, and $R2_{r\_line\_13}$.

where each array comprises a series of measured points at specific frequencies along the desired frequency range.

Figure 6:
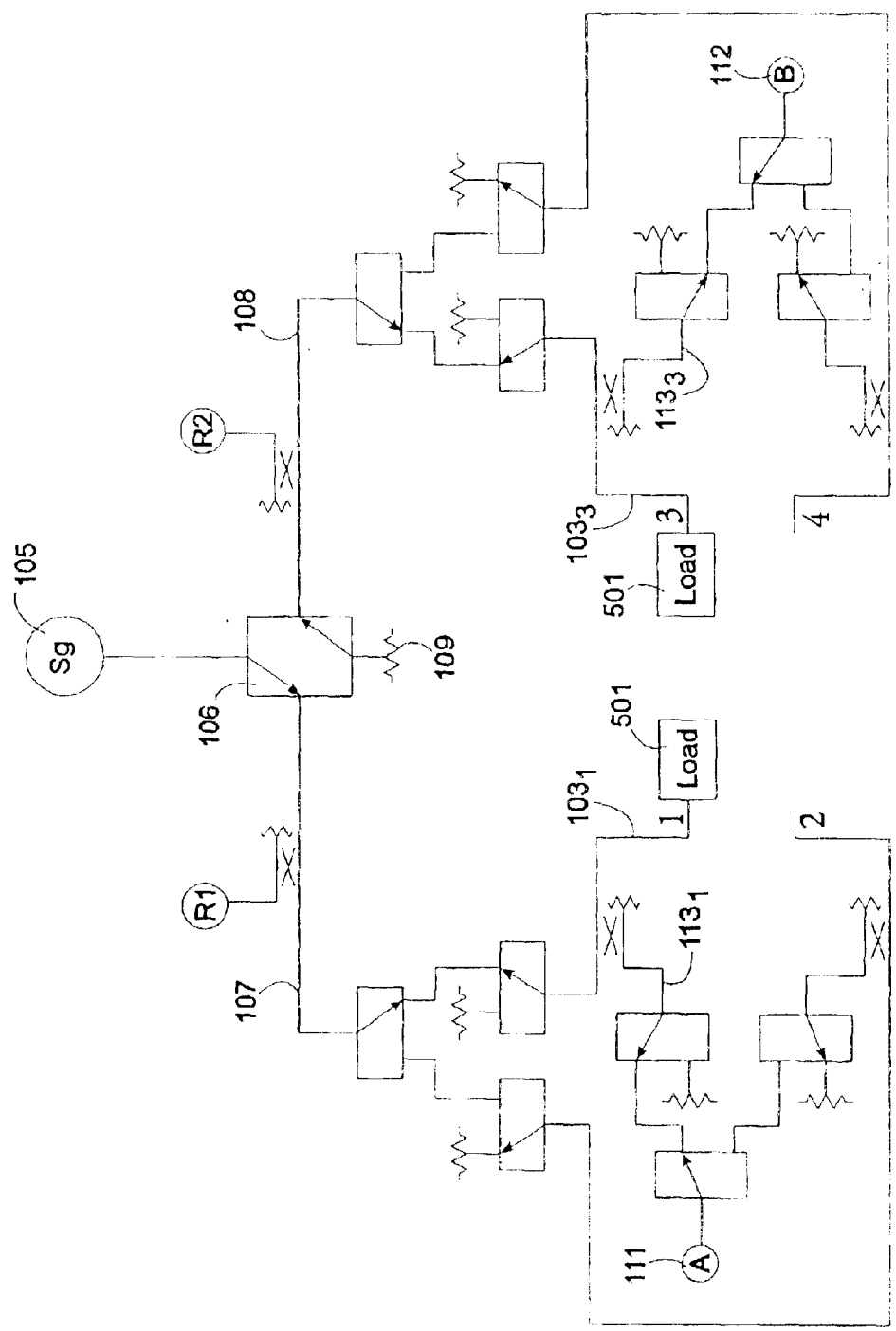

If a broader frequency range is necessary, the same measurement procedure is performed on the first direct pair, measurement ports $103_1$ and $103_3$ in the specific embodiment, with a different airline covering a different frequency band. In addition, the matched loads 501 as shown in FIG. 6 of the drawings may be used to simulate a high loss line having a perfect match in order to take measurements at lower frequencies than are practical with an airline calibration standard. Depending upon the matched load, the quality of the match at higher frequencies, and the desired frequency range, the matched loads may be used in place of the airline calibration standard. As new measurements are made for the different frequency ranges using the appropriate calibration standards, the results are stored in the forward and reverse direction arrays with each data point corresponding to a specific stimulus signal frequency. Accordingly, the calibration frequency band can extend over more frequencies than is possible with a single airline calibration standard.

Figure 7:
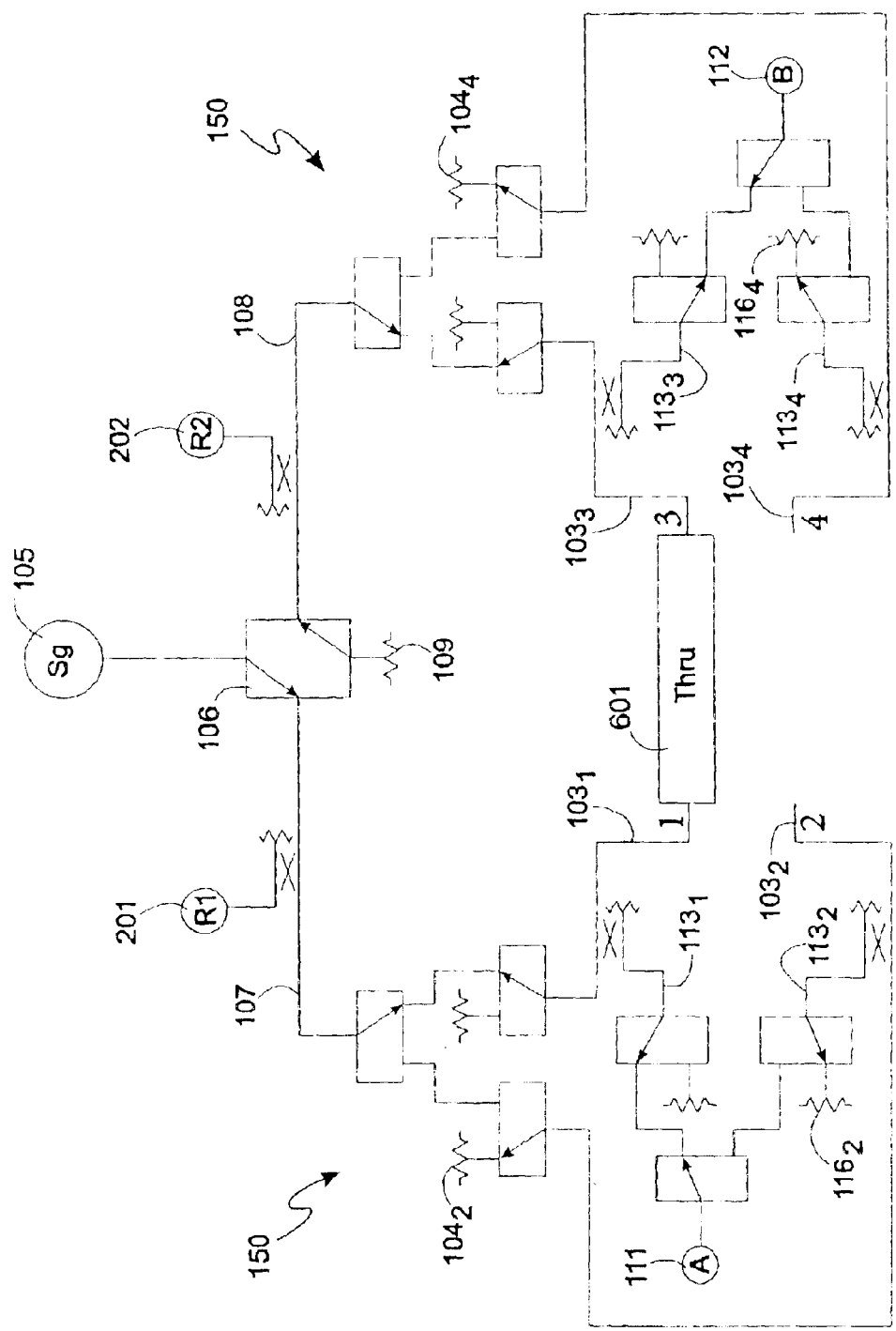

With specific reference to FIG. 7 of the drawings, a next step in the calibration process is to connect a through calibration standard 601 ("the thru 601") between the first direct pair, measurement port $103_1$ and measurement port $103_3$ in the illustrated embodiment. The thru 601 may have either a zero length or a non-zero length. In either case, an electrical length of the thru 601 must be a known value. For on-wafer measurements, it is not possible to obtain a high quality zero thru calibration standard. Accordingly, for on-wafer measurements, the non-zero thru calibration standard is used.

To measure the thru 601, the transfer switch 106 is set so that the signal generator 105 stimulates the first signal path 107 and the second signal path 108 is terminated in the transfer switch characteristic impedance 109. The switch network 150 is configured so that the measurement port $103_1$ accepts the stimulus signal from the first signal path 107 and the sampling arm $113_1$ is connected to the first test port 111. The switch network 150 is further configured so that the measurement port $103_3$ is terminated in the transfer switch characteristic impedance 109 through second signal path 108 and the sampling arm $113_3$ is connected to the second test port 112. The unused measurement ports 103, which in the specific embodiment comprise measurement ports of the second direct pair, measurement port $103_2$ and measurement port $103_4$, are terminated in the local characteristic impedances $104_2$ and $104_4$, respectively. The sampling arms $113_2$ and $113_4$ are also terminated in local sampling arm terminating loads $116_2$ and $116_4$. The signal generator 105 sweeps the desired frequency range and the VNA 200 measures signal level from the first and second test channels 111, 112 and the first and second reference receivers 201, 202 and stores the results in memory. According to the nomenclature used for purposes of the present disclosure, because the signal generator 105 is connected to the first signal path 107, the resulting measurements are considered forward direction measurements. Accordingly, the measurements made of the thru 601 in the forward direction are represented as the arrays:

$A_{f13\_thru}$, $B_{f13\_thru}$, $R1_{f13\_thru}$, and $R2_{f13\_thru}$.

where each array comprises a series of measured points at specific frequencies along the desired frequency range.

The transfer switch 106 is then set (not shown) so that the signal generator 105 stimulates the second signal path 108 and the first signal path is terminated in the transfer switch characteristic impedance 109. The switch network 150 is not changed. The signal generator 105 again sweeps the desired frequency range and the VNA 200 measures signal level from the first and second test channels 111, 112 and the first and second reference receivers 201, 202 and stores them in memory. Because the signal generator 105 is connected to the second signal path 108, the resulting measurements are considered reverse direction measurements. Accordingly, the measurements made of the thru 601 in the reverse direction are represented as the arrays:

$A_{r13\_thru}$, $B_{r13\_thru}$, $R1_{r13\_thru}$, and $R2_{r13\_thru}$.

where each array comprises a series of measured points at specific frequencies along the desired frequency range.

Figure 8:
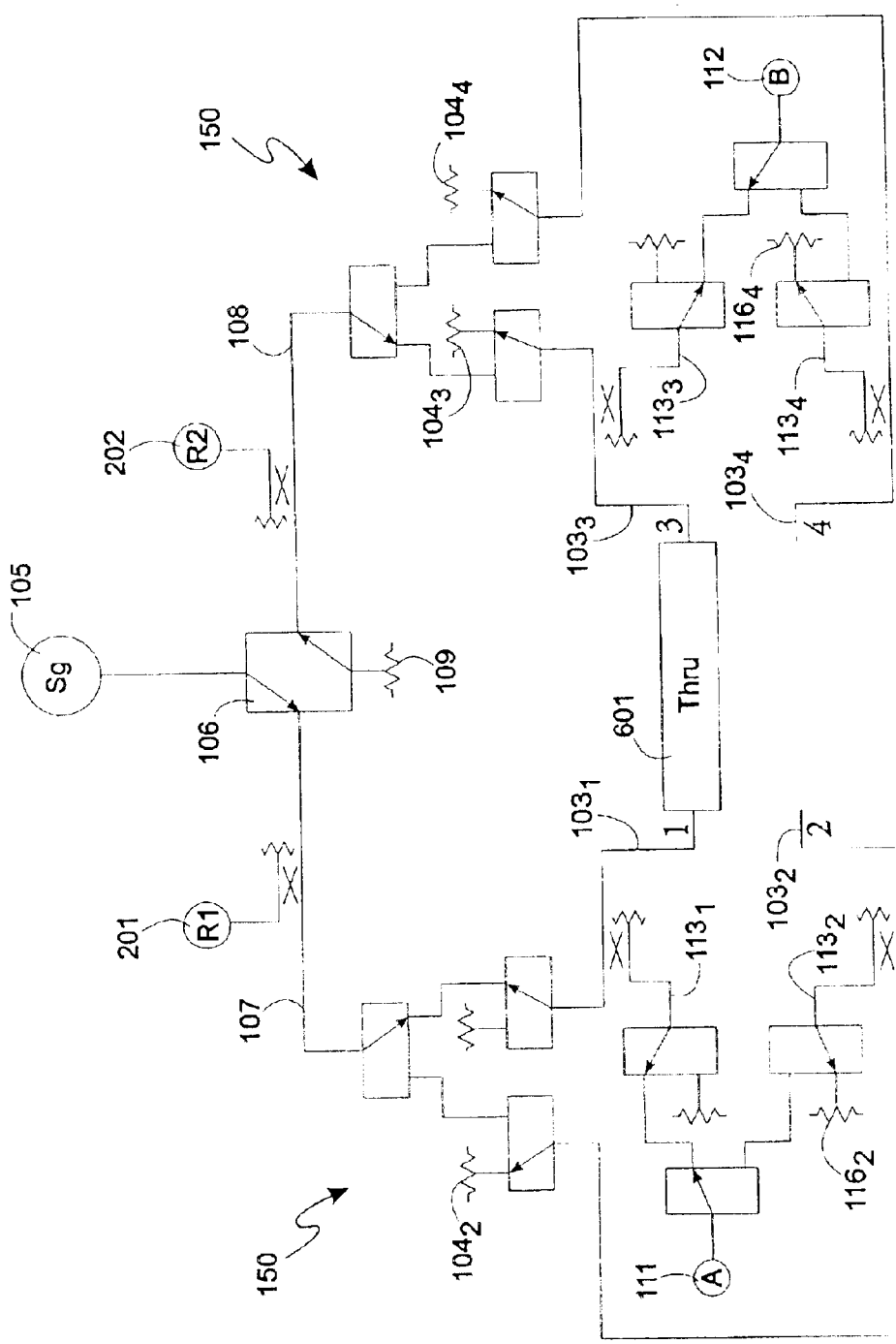

With specific reference to FIG. 8 of the drawings and with the thru 601 still connected, the transfer switch 106 is configured so that the signal generator 105 is in the first signal path 107 and the second signal path 108 is terminated in the characteristic impedance 109. Measurements of the first direct pair are still being made. Accordingly, the switch network 150 is configured so that the measurement port $103_1$ is connected to the first signal path 107 and the respective sampling arm $113_1$ is connected to the first test channel 111. The remaining unused measurement ports 103 capable of connection to the first test channel 111, measurement port $103_2$ in the specific example, are terminated at respective local characteristic impedances 104, local characteristic impedance $104_2$ in the specific example. In addition, the sampling arm $113_2$ of the unused measurement port $103_2$ is terminated in local sampling arm characteristic impedance $116_2$. The switch network 150 is further configured so that the measurement port capable of connection to the second test channel 112 in the first direct pair, specifically measurement port $103_3$, is terminated at the respective local characteristic impedance, $104_3$ in the specific example, and the respective sampling arm, $113_3$ is connected to the second test channel 112. The measurement ports 103 of the direct pairs not being measured are also terminated in local characteristic impedances, local characteristic impedance $104_2$ and $104_4$ in the specific example, and the respective sampling arms $113_2$ and $113_4$ are terminated in local sampling arm terminating load $116_2$ and $116_4$. The signal generator 105 is again swept through the desired frequency range and for each frequency point in the range, the VNA 200 measures a ratio of the reflection response over the stimulus and a ratio of the transmission response over the stimulus of the terminated thru 601 and stores the data in the following arrays:

$$A_{f13\_termthru}/R1_{f13\_termthru}$$

$$B_{f13\_termthru}/R1_{f13\_termthru}.$$

Figure 9:
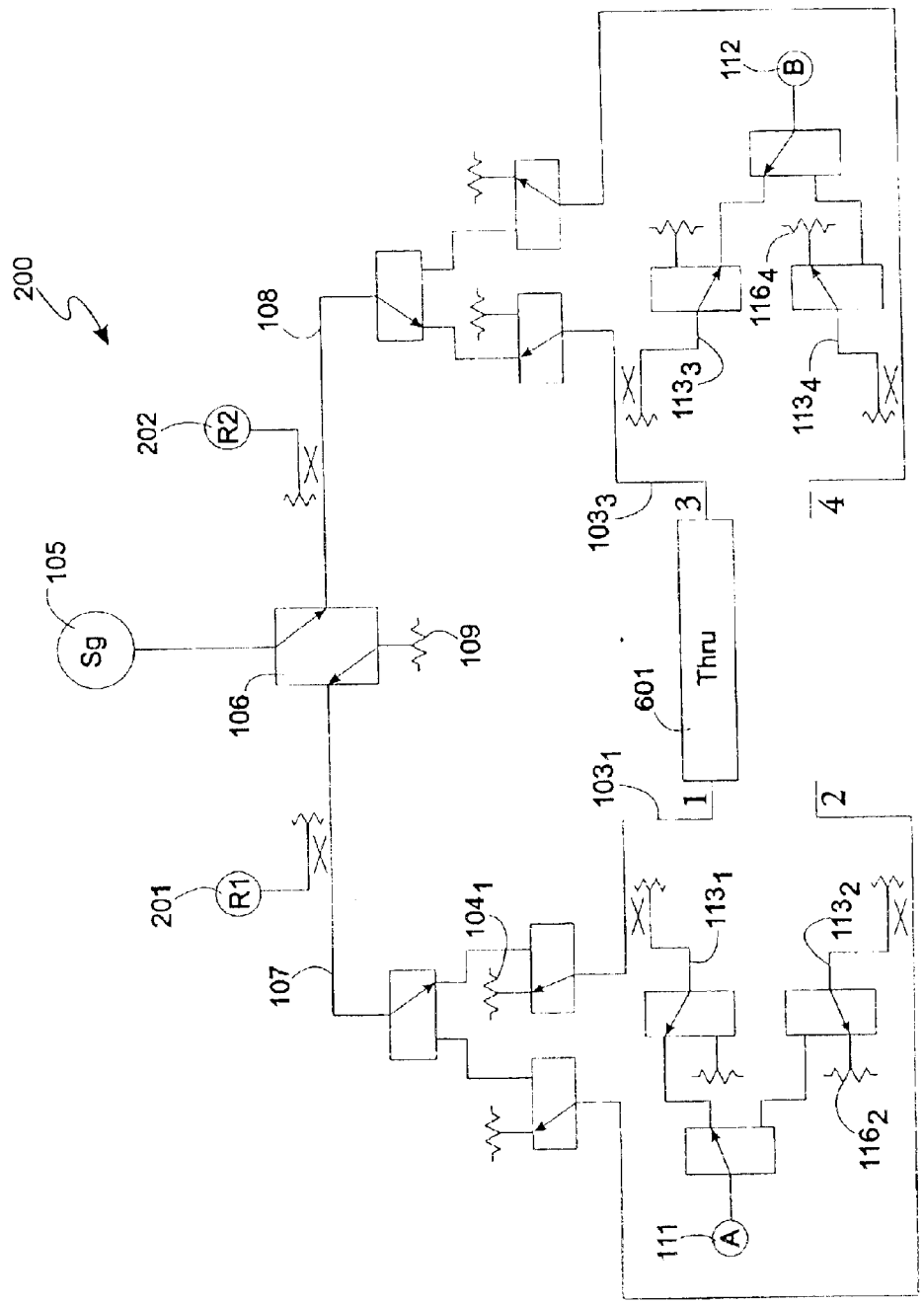
Figure 10:
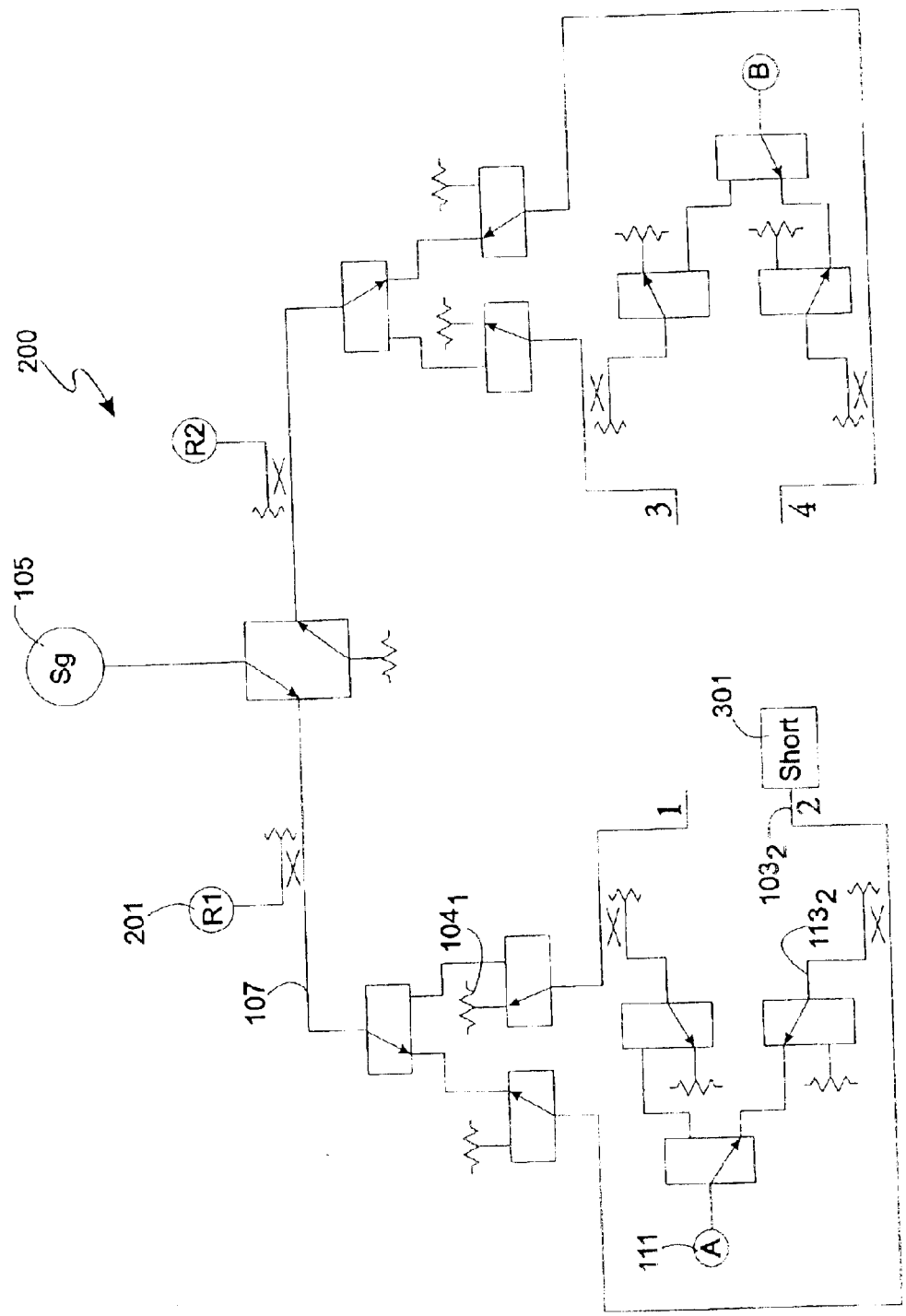
Figure 11:
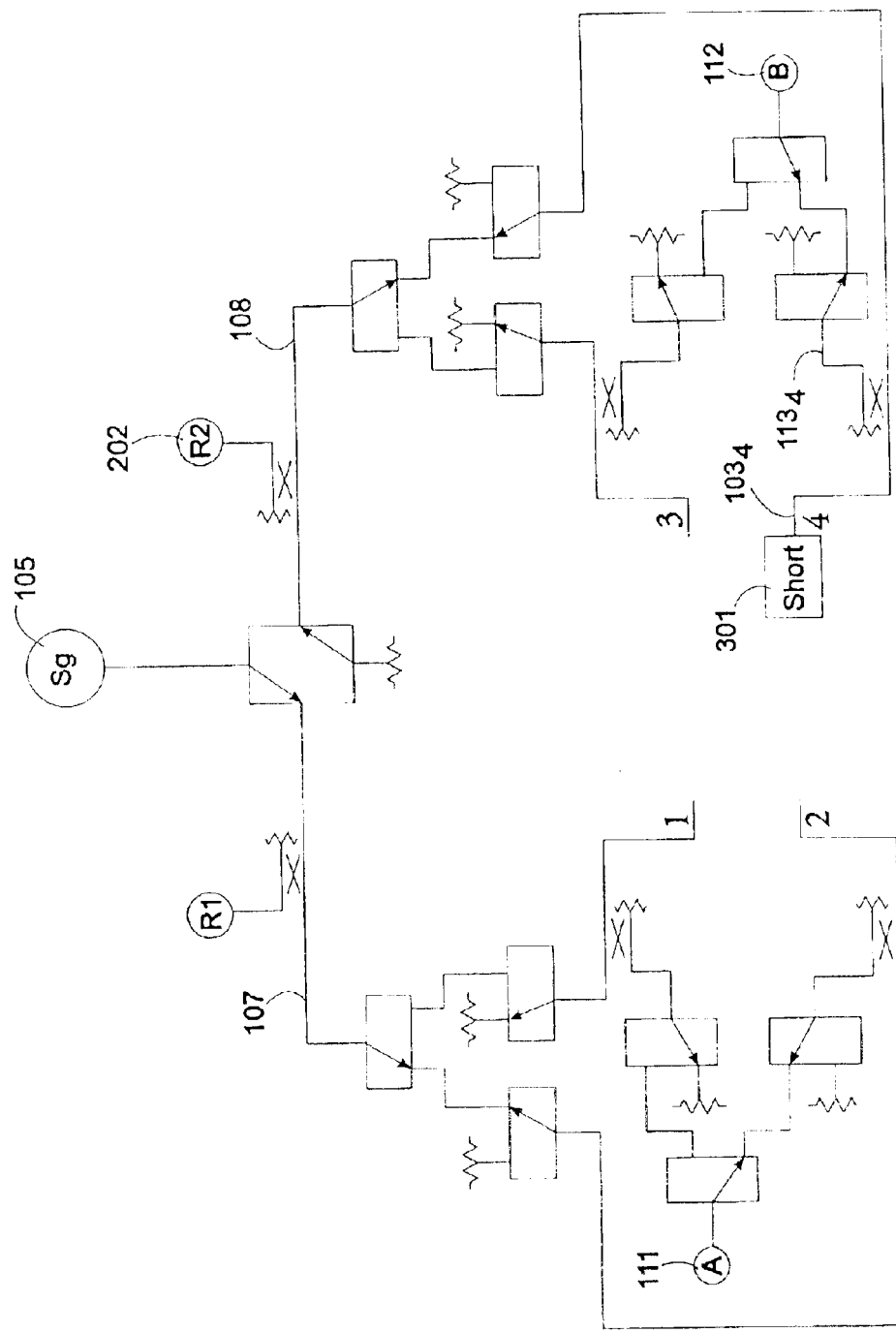
Figure 12:
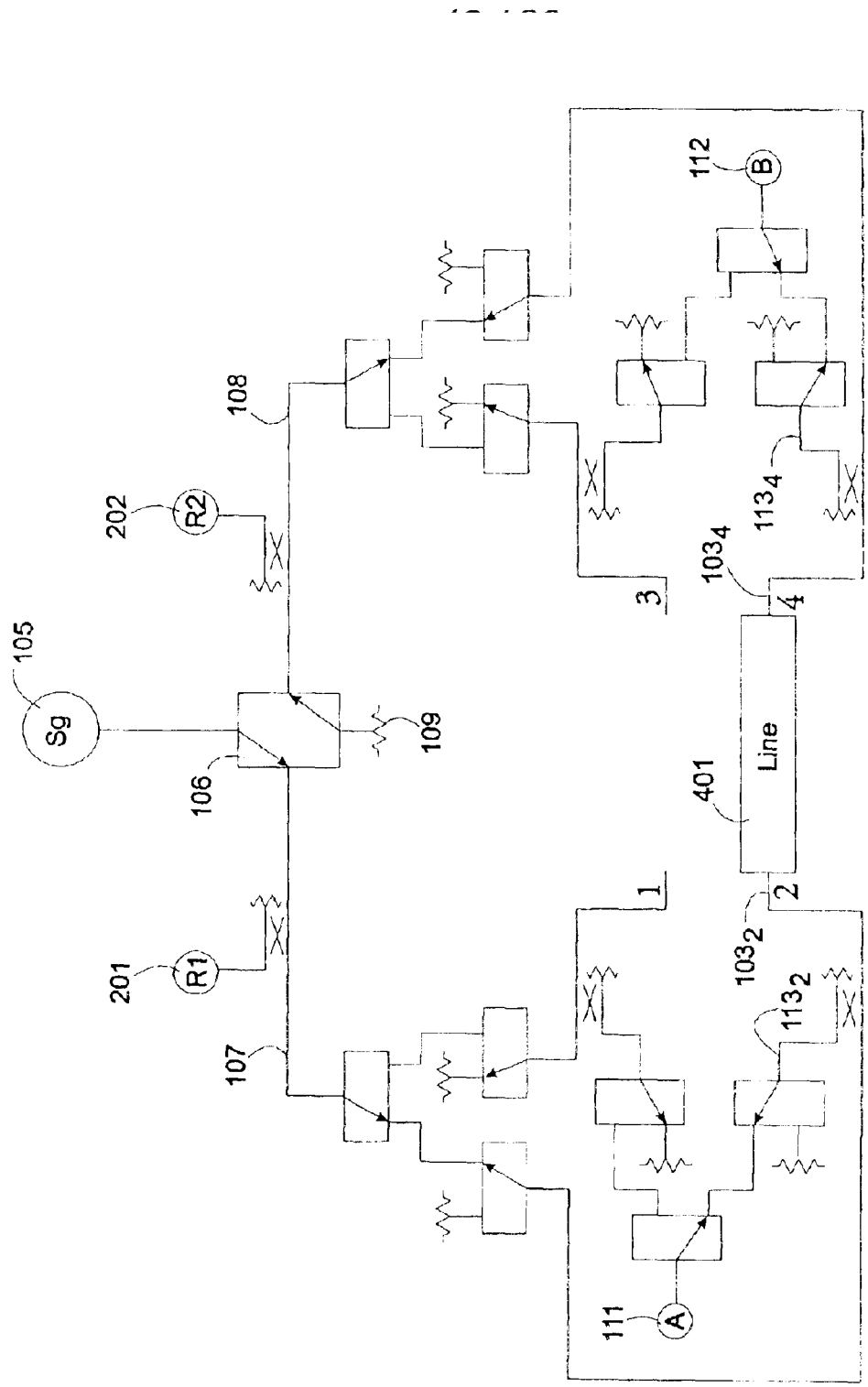
Figure 13:
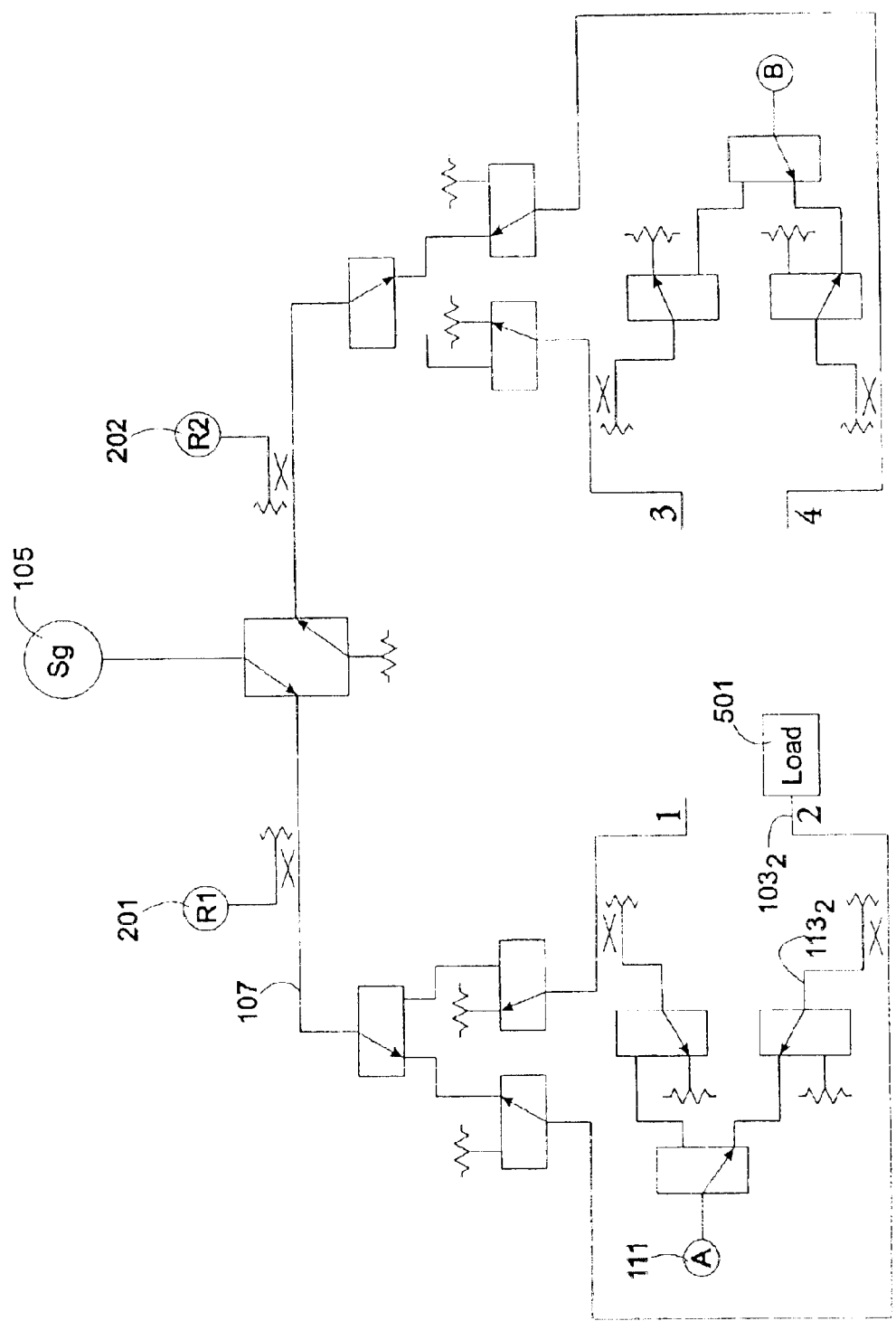
Figure 14:
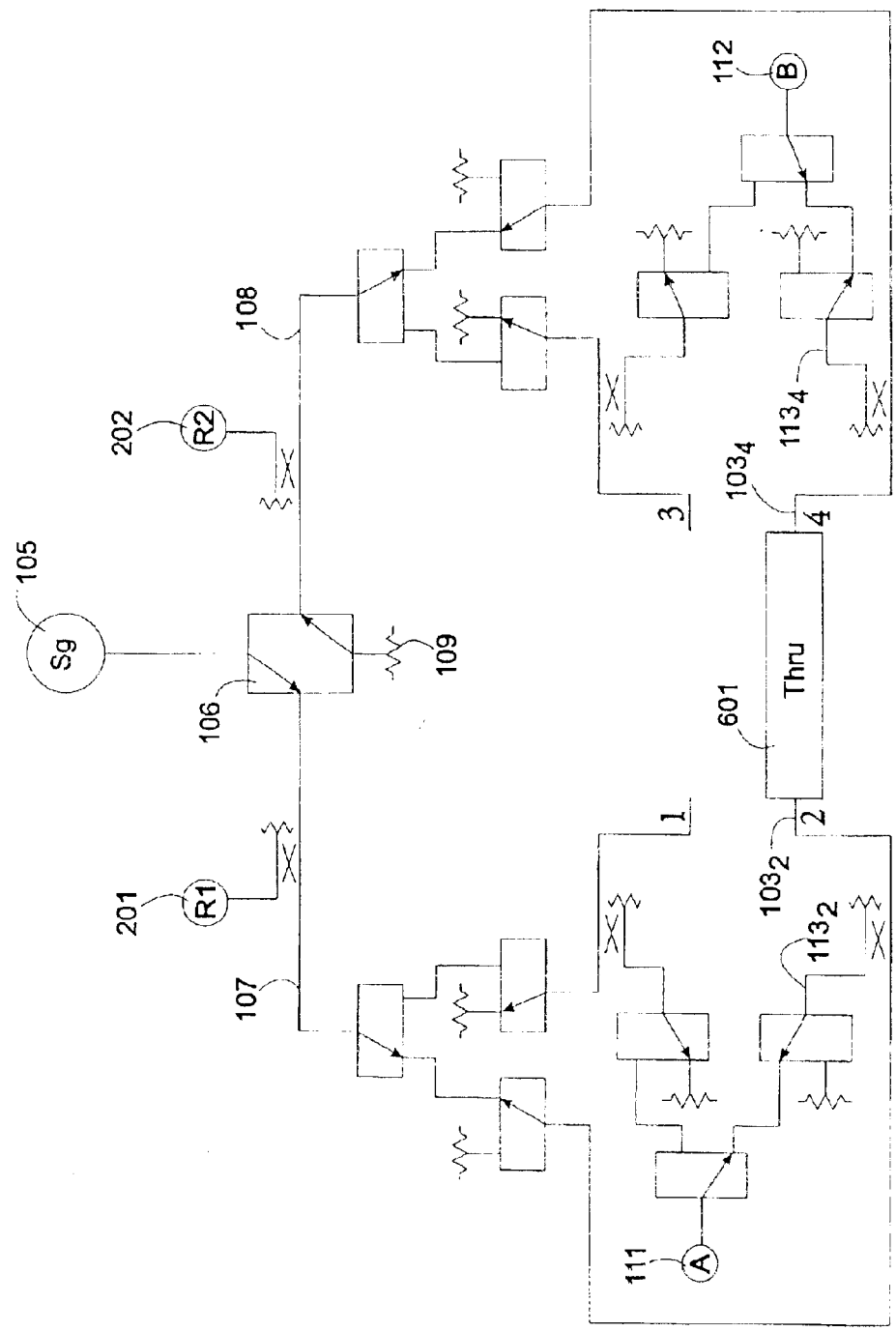
Figure 15:
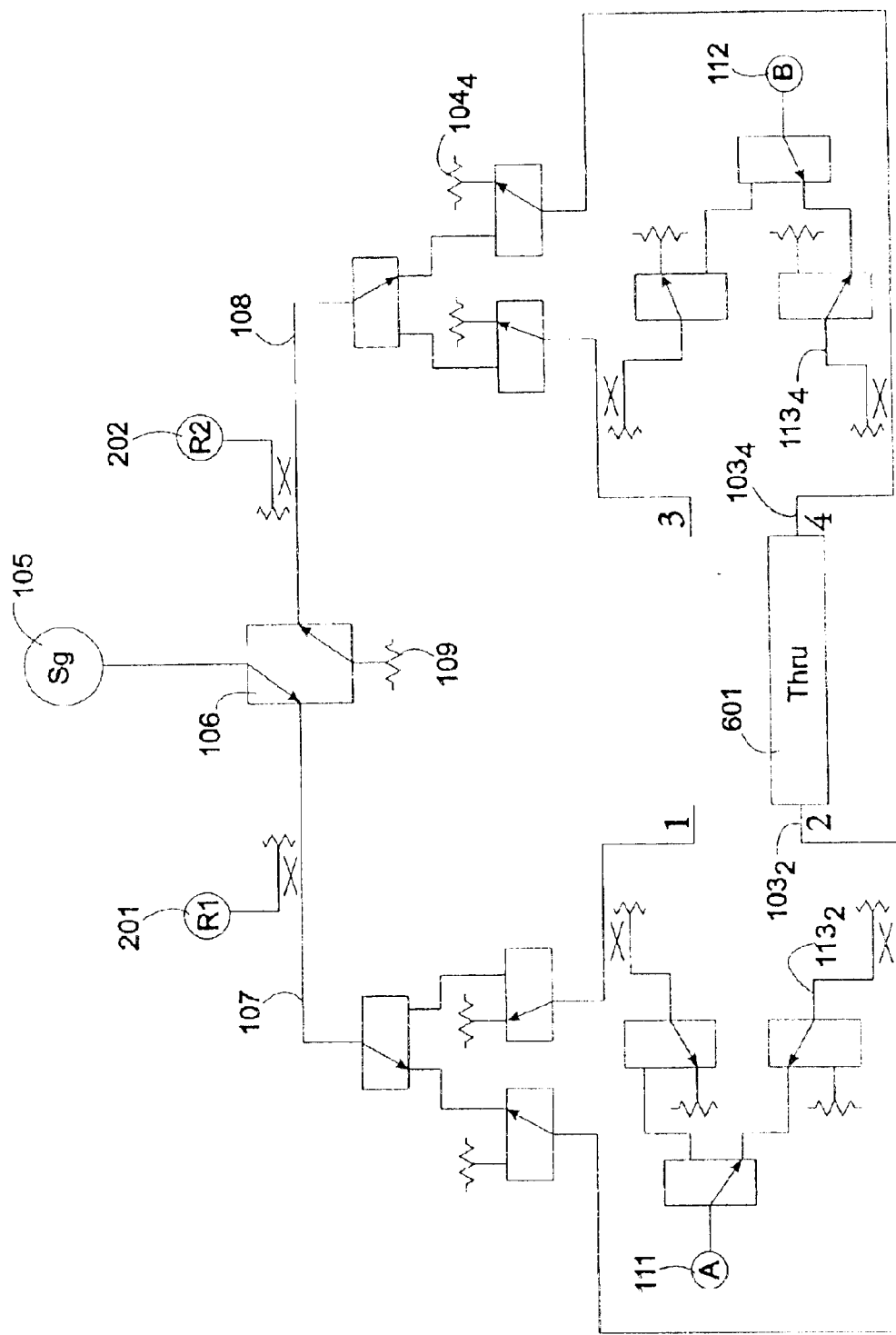
Figure 16:
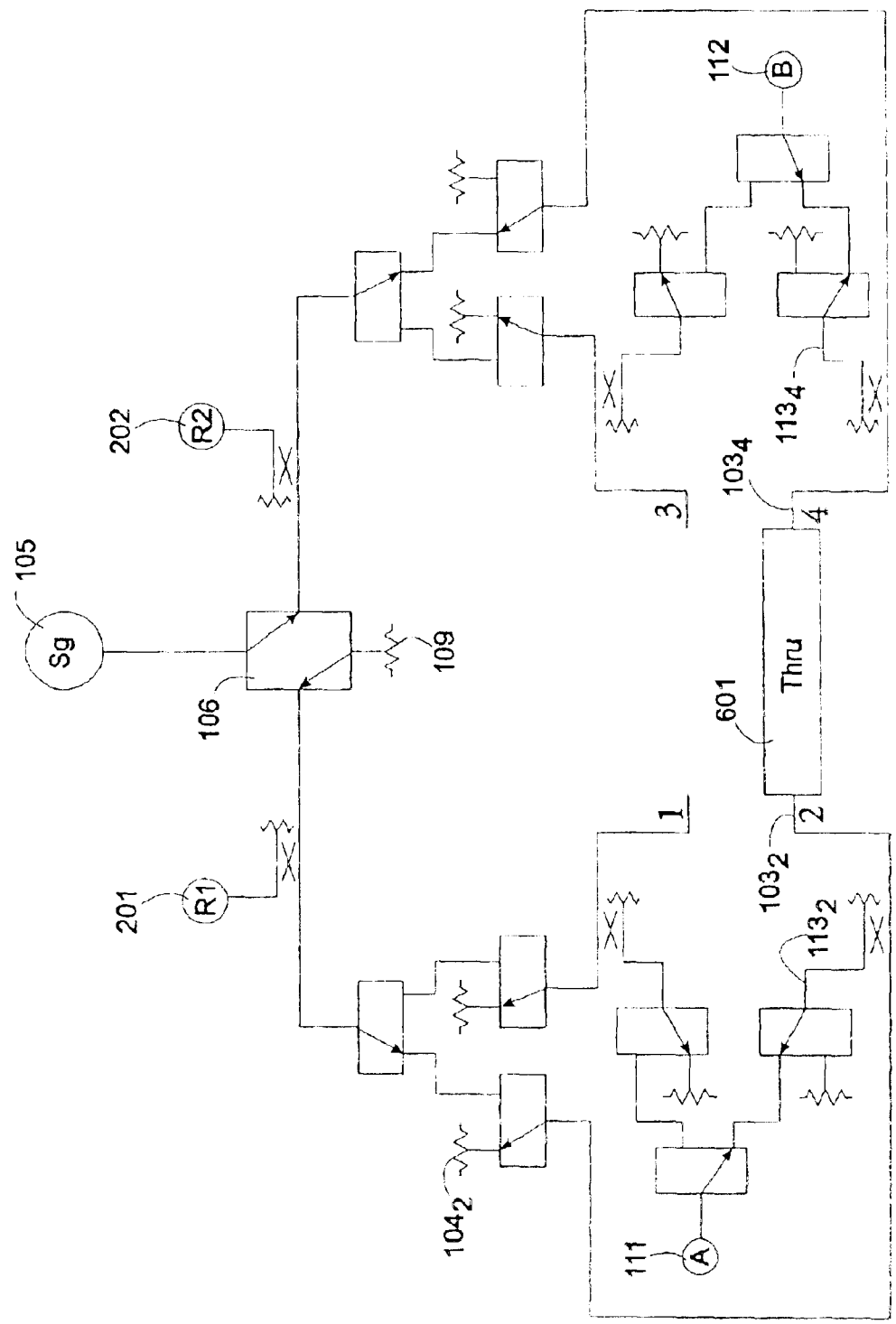

With specific reference to FIG. 9 of the drawings, the thru 601 is still connected between the measurement ports 103 of the first direct pair and the transfer switch 106 is then re-configured so that the signal generator 105 is in the second signal path 108 and the first signal path 107 is terminated in the characteristic impedance 109. The switch network 150 is also reconfigured so that the measurement port 103 in the first direct pair that is capable of connection to the second test channel 112, measurement port 103$_3$ in the illustrated example, is connected to the second signal path 108 and the respective sampling arm 113$_3$ is connected to the second test channel 112. The measurement port 103 in the first direct pair that is capable of connection to the first test channel 111, measurement port 103$_1$ in the illustrated example, is terminated in the respective local characteristic impedance 104$_1$ and the respective sampling arm 113$_1$ is connected to the first test channel 111. The measurement ports 103 of the direct pairs not being measured are locally terminated in their characteristic impedances, 104$_2$ and 104$_4$ in the illustrated example. Additionally, the sampling arms 113 of the unused measurement ports 103, sampling arms 113$_2$ and 113$_4$ in the illustrated example, are terminated in their respective local sampling arm terminating loads 116$_2$ and 116$_4$. The signal generator 105 is swept through the desired frequency range and for each frequency point in the range, the VNA 200 measures a ratio of the signal level of the reflection response of the terminated thru 601 over the signal level of the stimulus signal as measured at the reference channel 201, and a ratio of the signal level of the transmission response of the terminated thru 601 over the signal level of the stimulus signal. The measured values are stored in data arrays:

$$A_{r13\_termthru}/R1_{r13\_termthru}, \text{ and}$$

$$B_{r13\_termthru}/R2_{r13\_termthru}.$$

With specific reference to FIGS. 10 through 16 of the drawings, the same calibration steps and measurements described in reference to FIGS. 3 through 9 of the drawings, are carried out for the measurement ports that comprise the second direct pair, measurement port 103$_2$ and measurement port 103$_4$ in the illustrated example. Accordingly, the resulting data gathered through the process for the second direct pair is measured and stored in the data arrays:

$$A_{reflect\_2},$$

$$R1_{reflect\_2},$$

$$B_{reflect\_4},$$

$$R2_{reflect\_4},$$

$$A_{f24\_line},$$

$$B_{f24\_line},$$

$$R1_{f24\_line},$$

$$R2_{f24\_line},$$

$$A_{r24\_line},$$

$$B_{r24\_line},$$

$$R1_{r24\_line},$$

$$R2_{r24\_line},$$

$$A_{f24\_thru},$$

$$B_{f24\_thru},$$

$$R1_{f24\_thru},$$

$$R2_{f24\_thru},$$

$$A_{r24\_thru},$$

$$B_{r24\_thru},$$

$$R1_{r24\_thru},$$

$$R2_{r24\_thru},$$

$$A_{f24\_termthru}/R1_{f24\_termthru},$$

$$B_{f24\_termthru}/R1_{f24\_termthru},$$

$$B_{r24\_termthru}/R2_{r24\_termthru},$$

$$A_{r24\_termthru}/R2_{r24\_termthru}.$$

where all of the data arrays having a single point of measurement for each frequency measured in the desired frequency range. It is best practice to measure the same frequency points along the range so that each array has a measured value for each frequency point. It is acceptable, however, to interpolate the data to obtain a value for a specific frequency value as long as the frequency value is within the boundary of the lowest measured frequency and the highest measured frequency in the desired frequency range and the interval between measured frequencies is small enough to fully characterize the DUT including any resonances thereof. If multiple line calibration standards are used to obtain a broader frequency range, the measurements taken by the VNA 200 are stored in appropriate array elements in a larger array having an element for each frequency along the frequency range of interest. Accordingly, multiple steps of connecting calibration standards and making measurements may be performed to completely populate a single data array.

In a multiport calibration according to an aspect of an embodiment of the present invention, the same calibration steps and measurements described in FIGS. 3 through 9 of the drawings are carried out for the measurement ports of all of the direct pairs. The general description of a set of direct pairs for a DUT having 2N ports comprises the set where m is a set of integers between 1 and N, and the direct pairs are the measurement port 103$_m$ and measurement port 103$_{N+m}$. Measurements of each direct pair yield a 22 data arrays that are stored and maintained in an embodiment of a system according to the teachings of the present invention.

Figure 17:
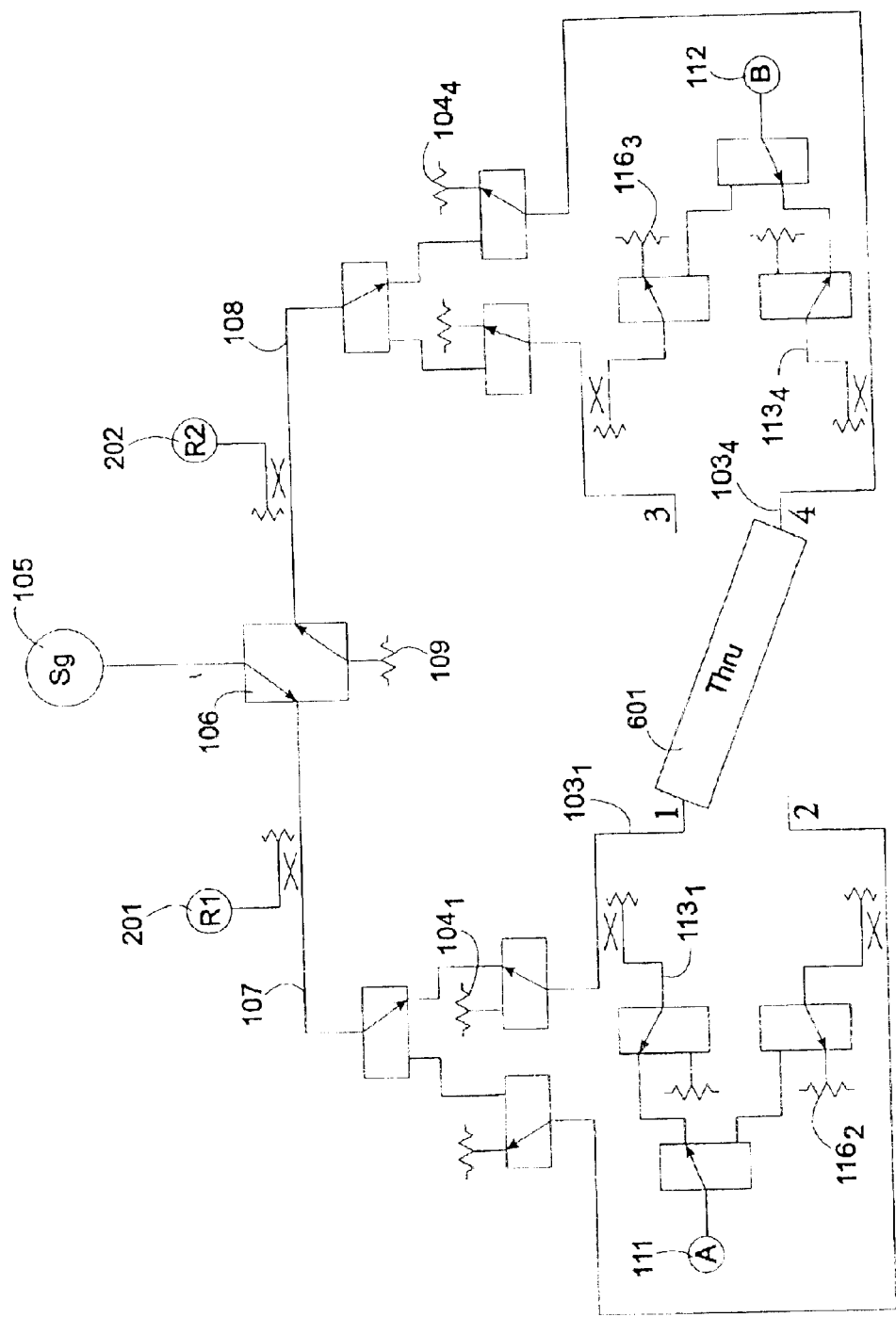
FIGS. 17 and 18 show steps for measuring indirect pairs of measurement ports in an embodiment of a method according to the present teachings.

With specific reference to FIG. 17 of the drawings, the next step of the process is to connect the thru 601 between the first indirect pair of measurement ports, which in the illustrated embodiment comprises measurement port 103$_1$ and measurement port 103$_4$. The signal transfer switch 106 is configured so that the signal generator 105 stimulates the first signal path 107 and the second signal path 108 is terminated in the characteristic impedance 109. The switch network 150 is configured so that the measurement port 103 of the first indirect pair that is capable of connection to the first test channel 111, measurement port 103$_1$ in the illustrated example, is connected to the first signal path 107 and the respective sampling arm $113_1$ is connected to the first test channel 111. The switch network 150 is further configured so that the measurement port 103 of the first indirect pair that is capable of connection to the second test channel 112, measurement port $103_4$ in the illustrated example, is terminated at the respective local terminating load $104_4$ and the respective sampling arm $113_4$ is connected to the second test channel 112. All unused measurement ports, measurement port $103_2$ and measurement port $103_3$ in the specific example, are terminated in the respective local terminating load $104_2$ and $104_3$ and their respective sampling arms $113_2$ and $113_4$ are terminated in respective local sampling arm terminating loads $116_2$ and $116_3$. The signal generator 105 is then swept over the desired frequency range and the ratio of the signal level at the first test channel 111 over the signal level at the first reference receiver 201 is measured and stored as additional data arrays:

$$A_{f14\_thruterm}/R1_{f14\_thruterm}, \text{ and}$$

$$B_{f14\_thruterm}/R1_{f14\_thruterm}.$$

The transfer switch 106 is then reconfigured (not shown) so that the signal generator 105 stimulates the second signal path 108 and the first signal path 107 is terminated in the characteristic impedance 109. The switch network 150 is configured so that the measurement port in the first indirect pair that is capable of connection to the first test channel 111, measurement port $103_1$, is terminated in the local terminating load $104_1$. The measurement port in the first indirect pair that is capable of connection to the second test channel 112, measurement port $103_4$ in the illustrated example, is connected to the second signal path 108. The signal generator 105 is then swept over the desired frequency range and the ratio of the signal level at the second test channel 112 over the signal level at the second reference receiver 202 is measured and stored as a additional arrays:

$$A_{r14\_thruterm}/R2_{r14\_thruterm},$$

$$B_{r14\_thruterm}/R2_{r14\_thruterm}.$$

Figure 18:
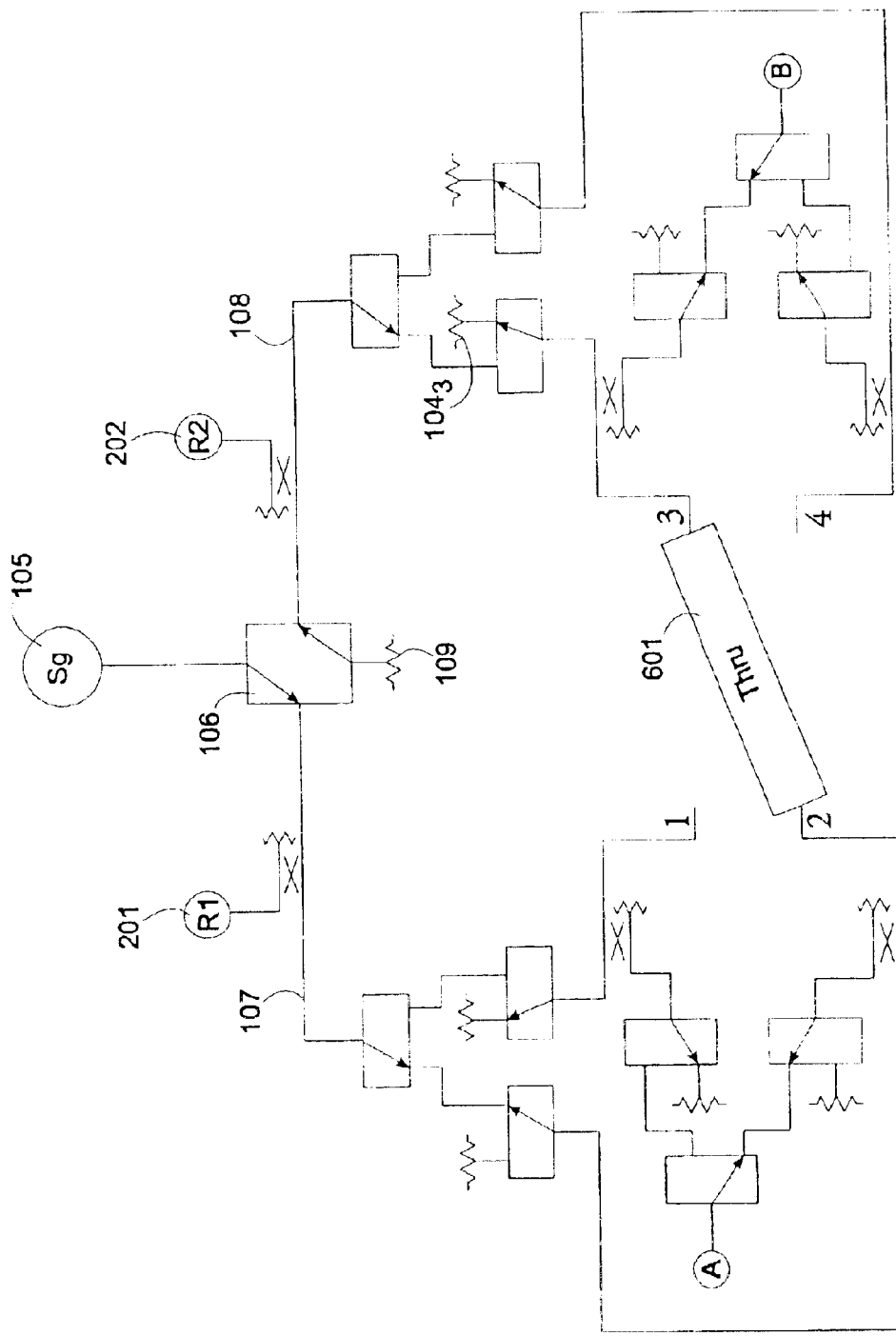

Similarly, and with specific reference to FIG. 18 of the drawings, the same measurement and storage steps made for the first indirect pair, measurement port $103_1$ and measurement port $103_4$ in the illustrated example, are performed for the second indirect pair, measurement port $103_2$ and measurement port $103_3$ in the illustrated example. Briefly, the thru 601 is connected between the measurement ports 103 of the second indirect pair. In a first step, the thru 601 is terminated in a local terminating impedance at $104_3$, is stimulated in a forward direction, while the ratio of the signal level present at the first test channel 111 over the first reference receiver 201 is measured and stored and the ratio of the signal level present at the second test channel 112 over the first reference receiver 201 is measured and stored to yield the frequency dependent data arrays:

$$A_{f23\_thruterm}/R1_{f23\_thru\_term}, \text{ and}$$

$$B_{f23\_thruterm}/R1_{f23\_thruterm}.$$

The switch network 150 is then reconfigured so that the signal generator 105 stimulates the second signal path 108, the measurement port 103 of the indirect pair capable of connection to the second test channel 112 is connected to the second signal path 108 and the measurement port 103 of the indirect pair capable of connection to the first test channel 111 is terminated in a local terminating load 104. The signal generator 105 is swept over the desired frequency range and the ratios are measured and stored to yield the frequency dependent arrays:

$$A_{r23\_thruterm}/R2_{r23\_thruterm}, \text{ and}$$

$$B_{r23\_thruterm}/R2_{r23\_thruterm}.$$

In a multiport embodiment of a method according to the teachings of the present invention, additional similar measurements are taken for each direct pair and each indirect pair of the measurement ports 103.

Figure 19:
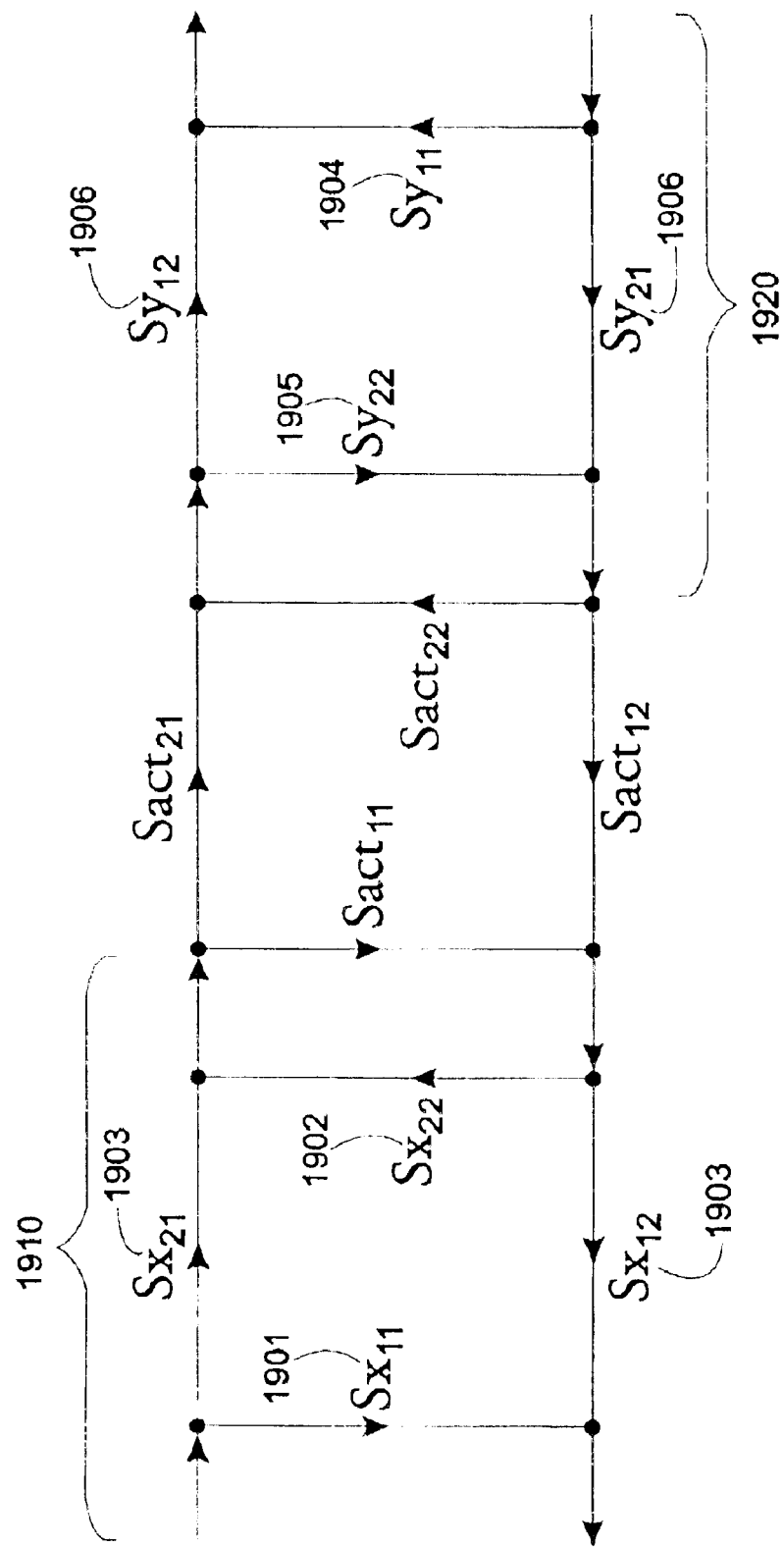
FIG. 19 shows a flow graph of error coefficients for X and Y error adapters.

With specific reference to FIG. 19 of the drawings, there is shown a TRL calibration flow graph between any first port and any second port of the VNA 200. A multiport embodiment has a different calibration flow graph to represent the directivity 1901, source match 1902, and reflection tracking error coefficients 1903 for the X error adapter 1910 and directivity 1904 source match 1905, and reflection tracking error coefficients 1906 for the Y error adapter 1920 An embodiment of a method according to the present teachings determines the X error adapter 1910 and the Y-error adapter 1920 for each direct pair. The flow graph represents an S-parameter matrix for the X error adapter 1910, $S_x$, which corresponds to the error artifacts for a first measurement port 103 in the direct pair, and an S-parameter matrix for the Y error adapter 1920, $S_y$, which corresponds to the error artifacts for a second measurements port 103 in the direct pair.

S-parameter matrix $S_{act}$ represents the S-parameters of an actual calibration standard without the contribution of the X and Y error adapters. The S-parameter matrices of the X error adapter may be expressed as T-parameters using the following known conversion where port 1 is on the left and port 2 is on the right when looking at the DUT 101:

$$Tx = \begin{bmatrix} Tx_{11} & Tx_{12} \\ Tx_{21} & Tx_{22} \end{bmatrix} = \begin{bmatrix} \frac{1}{Sx_{21}} & \frac{-Sx_{22}}{Sx_{21}} \\ \frac{Sx_{11}}{Sx_{21}} & \frac{Sx_{12}Sx_{21} - Sx_{11}Sx_{22}}{Sx_{21}} \end{bmatrix} \quad (1)$$

Accordingly, the matrix Sx may be converted into corresponding T-parameters expressed as Tx. If the matrix $T_{act\_thru}$ expresses the T-parameters of just the thru 601 and $T_{meas\_thru}$ expresses the T-parameters of the thru 601 as measured in context with the X and Y error adapters, then the following relationship holds true:

$$T_x T_{act\_thru} T_y = T_{meas\_thru} \quad (2)$$

Similarly, if the matrix $T_{act\_line}$ expresses the T-parameters of just the line 401 and $T_{meas\_line}$ expresses the T-parameters of the line 401 as measured in context with the X and Y error adapters, then the following relationship holds true:

$$T_x T_{act\_line} T_y = T_{meas\_line} \quad (3)$$

If the following relationships are defined:

$$T_{act\_x} = T_{act\_line} T_{act\_thru}^{-1} \quad (4)$$

and $$T_{meas\_x} = T_{meas\_line} T_{meas\_thru}^{-1} \quad (5)$$

then the following equation can be written $$T_x T_{act\_x} = T_{meas\_x} T_x \quad (6)$$

The thru 601 and the line 401 are each assumed to be perfectly matched. Therefore, the value of their reflection coefficient in the respective actual S-parameter matrix is set to zero. If the thru 601 has a non-zero length transmission coefficient, it is defined by $S_{21\_thru} = S_{12\_thru}$. The line 401 has a transmission coefficient defined by $S_{21\_line} = S_{12\_line}$. From equation (4), therefore $T_{act\_x}$ may be expressed as:

$$T_{act\_x} = \begin{bmatrix} \dfrac{S_{21\_thru}}{S_{21\_line}} & 0 \\ 0 & \dfrac{S_{21\_line}}{S_{21\_thru}} \end{bmatrix} \quad (7)$$

Measurements of the unterminated thru 601 and the line 401, each provide eight frequency dependent arrays of measured and stored results. There are four thru forward reflection and transmission arrays and four thru reverse reflection and transmission arrays. The arrays of measured data for the thru 601 are used in an algorithmic formulation in the S-parameter domain to compensate for the presence of the signal transfer switch 106 prior to calculation of the $T_{meas\_x}$ matrix. Both the $S_{meas\_line}$ and $S_{meas\_thru}$ are corrected by the formulation given by:

$$S_{corrected} = \begin{bmatrix} \dfrac{\left(\dfrac{A_f}{R1_f} - \dfrac{A_r}{R2_r}\dfrac{R2_f}{R1_f}\right)}{1 - \dfrac{R2_f}{R1_f}\dfrac{R1_r}{R2_r}} & \dfrac{\left(\dfrac{A_r}{R2_r} - \dfrac{A_f}{R1_f}\dfrac{R1_r}{R2_r}\right)}{1 - \dfrac{R2_f}{R1_f}\dfrac{R1_r}{R2_r}} \\ \dfrac{\left(\dfrac{B_f}{R1_f} - \dfrac{B_r}{R2_r}\dfrac{R2_f}{R1_f}\right)}{1 - \dfrac{R2_f}{R1_f}\dfrac{R1_r}{R2_r}} & \dfrac{\left(\dfrac{B_r}{R2_r} - \dfrac{B_f}{R1_f}\dfrac{R1_r}{R2_r}\right)}{1 - \dfrac{R2_f}{R1_f}\dfrac{R1_r}{R2_r}} \end{bmatrix} \quad (8)$$

where $A_f$, $B_f$, $R1_f$ and $R2_f$ are the forward direction raw measurement data, i.e. when the signal transfer switch 106 is directing the signal generator 105 to the first signal path 107, and $A_r$, $B_r$, $R1_r$ and $R2_r$ are the reverse direction raw measurement data, i.e. when the signal transfer switch 106 is directing the signal generator 105 to second signal path 108.

Referring now to the measurements of the first direct pair, measurement ports 103$_1$ and 103$_3$, a corrected S-parameter matrix of the thru 601 measured in cascaded combination with the X and Y error adapters for the first direct pair is expressed herein as $S_{meas13\_thru\_corrected}$. The correction formulation shown in equation (8) uses the arrays; $A_{f13\_thru}$, $B_{f13\_thru}$, $R1_{f13\_thru}$, $R2_{f13\_thru}$, $A_{r13\_thur}$, $B_{r13\_thru}$, $R1_{r13\_thru}$, and $R2_{r13\_thru}$ to calculate $S_{meas13\_thru\_corrected}$. Converting the $S_{meas13\_thru\_corrected}$ matrix to the corresponding T-parameters using equation (1) yields matrix $T_{meas13\_thru\_corrected}$. To obtain the $S_{meas13\_line\_corrected}$ matrix for the first direct pair, the correction formulation shown in equation (8) uses the arrays; $A_{f13\_line}$, $B_{f13\_line}$, $R1_{f13\_line}$, $R2_{f13\_line}$, $A_{r13\_line}$, $B_{r13\_line}$, $R1_{r13\_line}$, and $R2_{r13\_line}$. Converting the corrected $S_{meas13\_line\_corrected}$ matrix to the corresponding T-parameters, yields matrix $T_{meas13\_line\_corrected}$. The $T_{meas13\_thru\_corrected}$ and $T_{meas13\_line\_corrected}$ matrices are used in equations (4) and (5) to calculate $T_{act\_x}$ and $T_{meas\_x}$.

Referring now to the general case, $T_x$ is the T-parameter matrix for the X error adapter and is defined by its matrix elements as:

$$Tx = \begin{bmatrix} Tx_{11} & Tx_{12} \\ Tx_{21} & Tx_{22} \end{bmatrix} \quad (9)$$

$T_{meas\_x}$ is also defined by its matrix elements, and is represented as:

$$T_{meas\_x} = \begin{bmatrix} T_{meas\_x11} & T_{meas\_x12} \\ T_{meas\_x21} & T_{meas\_x22} \end{bmatrix} \quad (10)$$

From equation (5), $T_{meas\_x}$ for measurement ports 103$_1$ and 103$_3$, which is expressed as $T_{meas13\_x}$, is calculated using the $T_{meas13\_thru\_corrected}$ and $T_{meas13\_line\_corrected}$ matrices. Accordingly:

$$T_{meas13\_x} = T_{meas13\_line\_corrected} T_{meas13\_thru\_corrected}^{-1}$$

Using the relationship in equations (4), substituting the terms in equation (6), and eliminating the $S_{21\_thru}/S_{21\_line}$ term, the following general equation can be written:

$$\frac{Tx_{21}}{Tx_{11}} = \frac{\left(-T_{meas\_x11} + \sqrt{4T_{meas\_x12}T_{meas\_x21} + (T_{meas\_x11} - T_{meas\_x22})^2} + T_{meas\_x22}\right)}{2T_{meas\_x12}} \quad (11)$$

and $$\frac{Tx_{22}}{Tx_{12}} = \frac{\left(-T_{meas\_x11} + \sqrt{4T_{meas\_x12}T_{meas\_x21} + (T_{meas\_x11} - T_{meas\_x22})^2} + T_{meas\_x22}\right)}{2T_{meas\_x12}} \quad (12)$$

Based upon the T-parameter to S-parameter conversion, $Tx_{21}/Tx_{11}$ and $Tx_{22}/Tx_{12}$ in terms of the corresponding S-parameter error adapter matrix may also be expressed as:

$$\frac{Tx_{21}}{Tx_{11}} = Sx_{11} = B \tag{13}$$

and $$\frac{Tx_{22}}{Tx_{12}} = Sx_{11} - \frac{Sx_{12}Sx_{21}}{Sx_{22}} = A \tag{14}$$

As one of ordinary skill in the art can appreciate, equations (11) and (12) are equal. Because there is a square root in the solution, there are two possible mathematical solutions. The smaller valued solution, defined by B, corresponds to the directivity error coefficient 1901 of error adapter X. The larger valued solution, defined by A, is a mathematical combination of source match 1902 and reflection tracking 1903.

As mentioned before, at frequencies around 500 MHz and below, the dimensions of the line 401 become very large and not practical. Calculation of the directivity 1901 and the solution represented by A for the lower frequencies uses the measurements taken of the two high-quality matched loads 501 instead of the line 601. It is assumed that the matched loads 501 are perfectly matched to the measurement port and have a zero reflection coefficient. The same algorithmic formulations shown in equations (5) through (14) are used. To understand the usage of the measurement results from the two matched loads, note that the thru 601 has a non-zero-length transmission coefficient defined by $S_{12thru}=S_{12thru}$. The matched loads 501 have a transmission isolation coefficient defined by $S_{21load}=S_{12load}$. Due to the high isolation between the matched loads 501, $S_{21load}$ is close to a zero value. Accordingly, $S_{21load}$ is set to a very small, non-zero value, such as $10^{-10}$ in order to avoid division by zero ambiguity in the S-parameter to T-parameter conversion. From this, $T_{act\_x}$ at the lower frequencies can be calculated and is given by:

$$T_{act\_x} = \begin{bmatrix} \frac{S_{21\_thru}}{10^{-10}} & 0 \\ 0 & \frac{10^{-10}}{S_{21\_thru}} \end{bmatrix} \tag{15}$$

As shown before, by using equations (4) and (5), substituting results into equation (6) and eliminating the $S_{21\_thru}/10^{-10}$ term, equations (11) and (12) are derived. The S-parameters from the matched loads 501 are corrected using equation (8) to yield $S_{meas13\_load\_corrected}$, which is then converted using equation (1) to yield $T_{meas13\_load\_corrected}$. The $T_{meas13\_load\_corrected}$ term is used to calculate $T_{meas13\_x}$ in place of the terms measuring the line 401. The calculations in equations (11) and (12), therefore, are the same as for the line 401.

A similar process is performed to calculate terms in the error adapter Y. Beginning with equations (2) and (3) and defining the following relationships:

$$T_{act\_y}=T_{act\_thru}^{-1}T_{act\_line} \tag{16}$$

and $$T_{meas\_y}=T_{meas\_thru}^{-1}T_{meas\_line} \tag{17}$$

then the following equation can be written:

$$T_{act\_y}T_y=T_yT_{meas\_y} \tag{18}$$

With specific reference to FIG. 19 of the drawings, the known conversion for T-parameter matrix for the error adapter Y in terms of the S-parameters where port 1 is on the right and port 2 is on the left when looking at the DUT 101 is:

$$Ty = \begin{bmatrix} Ty_{11} & Tx_{12} \\ Ty_{21} & Ty_{22} \end{bmatrix} = \begin{bmatrix} \frac{1}{Sy_{12}} & \frac{-Sy_{11}}{Sy_{12}} \\ \frac{Sy_{22}}{Sy_{12}} & \frac{Sy_{12}Sy_{21}-Sy_{11}Sy_{22}}{Sy_{12}} \end{bmatrix} \tag{19}$$

Accordingly, the matrix Sy may be converted into corresponding T-parameters expressed as Ty. The $T_{meas13\_thru\_corrected}$ and $T_{meas13\_line\_corrected}$ matrices have already been calculated and are used in equation (17) to calculate $T_{meas13\_y}$, where:

$$T_{meas13\_y} = \begin{bmatrix} T_{meas13\_y11} & T_{meas13\_y12} \\ T_{meas13\_y21} & T_{meas13\_y22} \end{bmatrix} \tag{20}$$

Using equation (18), substituting the relationships in equations (16) and (17) and eliminating the $S_{21thru}/S_{21line}$ term, the following equation for the first direct pair can be written:

$$\frac{Ty_{12}}{Ty_{11}} = \frac{\left(-T_{meas13\_y11}+\sqrt{4T_{meas13\_y12}T_{meas13\_y21}+(T_{meas13\_y11}-T_{meas13\_y22})^2}+T_{meas13\_y22}\right)}{2T_{meas13\_y21}} \tag{21}$$

and $$\frac{Ty_{22}}{Ty_{21}} = \frac{\left(-T_{meas13\_y11}+\sqrt{4T_{meas13\_y12}T_{meas13\_y21}+(T_{meas13\_y11}-T_{meas13\_y22})^2}+T_{meas13\_y22}\right)}{2T_{meas13\_y21}} \tag{22}$$

From equation (19), $$\frac{Ty_{12}}{Ty_{11}} \text{ and } \frac{Ty_{22}}{Ty_{21}}$$

in terms of the corresponding the S-parameters for the error adapter Y is also given by:

$$\frac{Ty_{12}}{Ty_{11}} = -Sy_{11} = D \tag{23}$$

and $$\frac{Ty_{22}}{Ty_{21}} = \frac{Sy_{12}Sy_{21}}{Sy_{22}} - Sy_{11} = C \tag{24}$$

As one of ordinary skill in the art can appreciate, equations (21) and (22) are equal and because of the square root have two solutions. The smaller value or the first solution, defined by $Sy_{11}$, corresponds to the directivity error of the Y error adapter. The larger value or the second solution, defined by C, corresponds to the error coefficient, $$\frac{Sy_{12}Sy_{21}}{Sy_{22}} - Sy_{11},$$

for the Y error adapter.

With reference to the portion of the calibration procedure that measures the high reflect calibration standard as illustrated in FIGS. 3 and 4 of the drawings, the high reflect standard 301, is connected to one measurement port $103_1$ of the first direct pair and the same high reflect standard 301 is disconnected from the measurement port $103_1$ and is then connected to the other measurement port $103_3$ of the direct pair. With specific reference to FIG. 19 of the drawings the following equation can be written:

$$\Gamma_{\text{meas\_reflect\_x}} = Sx_{11} + \frac{Sx_{12}Sx_{21}\Gamma_{\text{act\_reflect\_x}}}{1 - Sx_{22}\Gamma_{\text{act\_reflect\_x}}} \tag{25}$$

where $\Gamma_{\text{meas\_reflect\_x}}$ is the measured reflection coefficient of the high reflect standard 301 at the measurement port capable of connection to the first test channel, measurement port $103_1$ in the first direct pair, and $\Gamma_{\text{act\_reflect\_x}}$ is the actual reflection coefficient of the high reflect standard at the same measurement port $103_1$. The same high reflect calibration standard 301 is connected to the opposite port in the first direct pair, measurement port $103_3$ in the specific example. With respect to the error adapter Y, the following equation can also be written:

$$\Gamma_{\text{meas\_reflect\_y}} = Sy_{11} + \frac{Sy_{12}Sy_{21}\Gamma_{\text{act\_reflect\_y}}}{1 - Sy_{22}\Gamma_{\text{act\_reflect\_y}}} \tag{26}$$

where $\Gamma_{\text{meas\_reflect\_y}}$ is the measured reflection coefficient of the high reflect standard 301 at measurement port $103_3$ and $\Gamma_{\text{act\_reflect\_y}}$ is the actual reflection coefficient of the high reflect standard at the measurement port $103_3$. A value for the measured reflection coefficient of the high reflect standard, $\Gamma_{\text{meas\_reflect\_x}}$, for the measurement port $103_1$ may be obtained from the following measured and stored arrays $A_{\text{reflect\_1}}/R1_{\text{reflect\_1}}$. Similarly, a value for the measured reflection coefficient of the high reflect standard, $\Gamma_{\text{meas\_reflect\_y}}$, for the measurement port $103_3$ may be obtained from the following measured and stored arrays $B_{\text{reflect\_3}}/R2_{\text{reflect\_3}}$. Because the same high reflect standard is connected to measurement ports $103_1$ and $103_3$, it is possible to solve for $\Gamma_{\text{act\_reflect\_x}}$ in equation (25) and $\Gamma_{\text{act\_reflect\_y}}$ in equation (26), and set the $\Gamma$ terms equal to each other. From the resulting relationship and equations (13), (14), (23), (24), (25) and (26), the following relationship can be written:

$$Sx_{22} = \frac{(B - \Gamma_{\text{meas\_reflect\_x}})(C - \Gamma_{\text{meas\_reflect\_y}})Sy_{22}}{(A - \Gamma_{\text{meas\_reflect\_x}})(D - \Gamma_{\text{meas\_reflect\_y}})} \tag{27}$$

As one of ordinary skill in the art appreciates, equation (27) has two unknown terms, but permits the expression of $Sx_{22}$ in terms of $Sy_{22}$. Accordingly, another relationship is necessary in order to solve for these two unknown terms.

With specific reference to FIGS. 7 and 19, the following equation can also be written:

$$\Gamma_{\text{meas\_thru11}} = Sx_{11} + \frac{Sx_{12}Sx_{21}Sy_{22}}{1 - Sx_{22}Sy_{22}} \tag{28}$$

where $\Gamma_{\text{meas\_thru11}}$ is measured as $A_{f13\_thru}/R1_{f13\_thru}$ for the measurement port of the first direct pair that is capable of connection to the first test channel 111. From (13), (14), (23) and (24), the following can be written $$Sx_{22} = \sqrt{\frac{(B - \Gamma_{\text{meas\_reflect\_x}})(C - \Gamma_{\text{meas\_reflect\_y}})(B - \Gamma_{\text{meas\_thru11}})}{(A - \Gamma_{\text{meas\_reflect\_x}})(D - \Gamma_{\text{meas\_reflect\_y}})(A - \Gamma_{\text{meas\_thru11}})}} \tag{29}$$

and $Sx_{22\ may}$ be calculated. $Sx_{22}$ is the source match error coefficient at the first measurement port $103_1$. Due to the square root in equation (29), there are 2 solutions for $Sx_{22}$. Having an approximate value of the argument of the high reflect calibration standard, however, the correct choice can be made. For example a short circuit calibration standard should have an argument of 180 degrees and an open circuit calibration standard should have an argument of zero degrees.

If a non-zero thru 601 is used, then the phase rotation of the reflect 301 is calculated from the electrical length of the non-zero through. From this calculation, a correct solution for $Sx_{22}$ from equation (29) is apparent. Accordingly, the type of reflect 301, whether a short circuit or an open circuit, and an electrical length of the non-zero thru must be known. If the reflect 301 is an offset short, it is also necessary to know the phase of the offset.

When a value for $Sx_{22}$ is known, a value for $Sy_{22}$ may be calculated from equation (27). $Sy_{22}$ is the source match error coefficient of error adapter Y at the measurement port capable of connection to the second test channel 112, which is measurement port $103_3$ in the specific example.

Because a definite value for $Sx_{22}$ is known, equations (13), (14) and (29) permit calculation of a reflection tracking coefficient for the error adapter X and is given by:

$$Sx_{12}Sx_{21} = (B-A)Sx_{22} \tag{30}$$

Similarly, a definite value for $Sy_{22}$ and equations (23), (24) and (27) permit calculation of a reflection tracking for the error adapter Y and is given by:

$$Sy_{12}Sy_{21} = (D-C)Sy_{22} \tag{31}$$

At this point in the process, the directivity, source match and reflection tracking for the error adapter X and the error adapter Y are determined. The X error adapters are defined as the error artifacts presented in series with the measurement ports 103 capable of connection to the first test channel 111. Similarly, the Y error adapters are defined as the error artifacts presented in series with the measurement ports 103 capable of connection to the second test channel 112.

In the specific four-port embodiment, the measurements and calculations described herein for measurement ports 103₁ and 103₃ yield directivity, source match and reflection tracking for the error adapter X related to measurement port 103₁ and directivity, source match, and reflection tracking for the error adapter Y related to measurement port 103₃. The same measurements and calculations described herein for measurement ports 103₁ and 103₃ are performed for the second direct pair. Specifically, measurements and calculations are made for measurement ports 103₂ and 103₄ to yield directivity, source match and reflection tracking for the error adapter X related to measurement port 103₂ and directivity, source match, and reflection tracking for the error adapter Y related to measurement port 103₄. In a multiport embodiment, the same measurements and calculations are made for each direct pair to yield directivity, source match and reflection tracking for the error adapter X related to the measurement port of the direct pair capable of connection to the first test channel 111 and directivity, source match, and reflection tracking for the error adapter Y related to the measurement port of the direct pair capable of connection to the second test channel 112. Accordingly, a 2N port DUT 100 has N different X error adapter and N different Y error adapter associated therewith.

Using the forward reflection and transmission measurements made on the terminated thru 601, which in a specific example of the first direct pair are the $A_{f13\_termthru}/R1_{f13\_termthru}$ and $B_{f13\_termthru}/R1_{f13\_termthru}$ arrays, it is possible to solve for a load match error coefficient presented at the measurement port capable of connection to the second test channel 112 and a forward transmission tracking error coefficient for the first direct pair. The load match for the measurement port 103₃, $\Gamma_{L3}$, and forward transmission tracking for the first direct pair, $\tau_{13}$, are given by:

$$\Gamma_{L3} = \frac{Sx_{11} - (A_{f13\_termthru}/R1_{f13\_termthru})}{Sx_{11}Sx_{22} - Sx_{12}Sx_{21} - Sx_{22}(A_{f13\_termthru}/R1_{f13\_termthru})} \quad (32)$$

and $$\tau_{13} = (B_{f13\_termthru}/R1_{f13\_termthru})(1-SX_{22}\Gamma_{L3}) \quad (33)$$

Using the reverse reflection and transmission measurements made on the terminated thru 601, which in a specific example of the first direct pair are the $A_{r13\_termthru}/R2_{r13\_termthru}$ and $B_{r13\_termthru}/R2_{r13\_termthru}$ arrays, it is possible to solve for a load match error coefficient presented at the measurement port capable of connection to the first test channel 111 and a reverse transmission tracking error coefficient for the first direct pair. The load match for the measurement port 103₁, $\Gamma_{L1}$, and the reverse transmission tracking coefficient, $\tau_{31}$, are given by:

$$\Gamma_{LI} = \frac{Sy_{11} - (B_{r13\_termthru}/R2_{r13\_termthru})}{Sy_{11}Sy_{22} - Sy_{12}Sy_{21} - Sy_{22}(B_{r13\_termthru}/R2_{r13\_termthru})} \quad (34)$$

and $$\tau_{31} = (A_{r13\_termthru}/R2_{r13\_termthru})(1-SY_{22}\Gamma_{L1}) \quad (35)$$

In the specific illustrated embodiment, using the measurements made of the terminated thru for the second direct pair, the same algorithmic formulations shown in equations (32) through (35) as described for measurement ports 103₁ and 103₃ are applied to the measurement ports 103₂ and 103₄. Accordingly, directivity, source match, reflection tracking and load match error coefficients for each measurement port in the first and second direct pairs and forward and reverse transmission tracking error coefficients for the first and second direct pairs are determined. In a multiport embodiment of a method according to the teachings of the present invention, the directivity, source match, reflection tracking and load match error coefficients for each measurement port in all of the direct pairs and forward and reverse transmission tracking error coefficients for all of the direct pairs are similarly determined.

Using the measurements of the thru 601 using the first indirect pair, measurement ports 103₁ and 103₄, the forward and reverse transmission tracking error coefficients,$\tau_{14}$ and $\tau_{41}$, is determined. The measured and stored arrays, $A_{f14\_thruterm}/R1_{f14\_thru\_term}$ and $B_{f14\_thruterm}/R1_{f14\_thruterm}$, are inserted into an equation similar to equation (33) and the measured and stored arrays, $A_{r14\_thruterm}/R2_{r14\_thru\_term}$ and $B_{r14\_thruterm}/R2_{r14\_thruterm}$, are inserted in an equation similar to equation (35). Using the load match error coefficients already calculated for each of the measurement ports 103, the forward and reverse transmission tracking for the indirect pair comprising measurement ports 103₁ and 103₄ is calculated as follows:

$$\tau_{14} = (B_{f14\_termthru}/R1_{f14\_termthru})(1-SX_{22}\Gamma_{L4}) \quad (36)$$

and $$\tau_{41} = (A_{r4l\_termthru}/R2_{r41\_termthru})(1-SX_{22}\Gamma_{L1}) \quad (37)$$

Similar calculations are made for the remaining indirect pairs. In the specific embodiment illustrated, the measured and stored arrays, $A_{f23\_thruterm}/R1_{f23\_thru\_term}$ and $B_{f23\_thruterm}/R1_{f23\_thruterm}$, are used to calculate the forward transmission tracking error coefficient for the indirect pair comprising measurement ports 103₂ and 103₃ and the measured and stored arrays, $A_{r23\_thruterm}/R2_{r23\_thruterm}$ and $B_{r23\_thruterm}/R2_{r23\_thruterm}$, are used to calculate the reverse transmission tracking error coefficient for the same indirect pair.

Forward and reverse transmission tracking error coefficients between the measurement ports 103 capable of connection to the same test channel, either the first test channel 111 or the second test channel 112, are herein referred to as "proximal pairs". In the specific illustrated embodiment the proximal pairs are measurement ports 103₁ and 103₂, measurement ports 103₃ and 103₄. The related forward and reverse transmission tracking error coefficients of the proximal pairs are; $\tau_{12}$, $\tau_{21}$, $\tau_{34}$, and $\tau_{43}$, which may be determined either through measurement and calculation or through pure calculation. The method for pure calculation of the forward and reverse transmission tracking error coefficients is taught in the '040 Patent Application.

The forward transmission tracking error coefficient for each proximal pair where both measurement ports 103 of the proximal pair are capable of connection to the first test channel 111 is measured and calculated by connecting the thru 601 between the measurement ports 103 of the proximal pair, connecting the signal generator 105 to a first one of the measurement ports 103 of the proximal pair and terminating the sampling arm 113 in a local terminating impedance 116. For purposes of nomenclature, the first measurement port 103 of the proximal pair is designated as "port F". The other measurement port 103 of the proximal pair, which for purposes of nomenclature is designated as "port G", is terminated in a local terminating impedance 104, and the respective sampling arm 113 is connected to the first test channel 111. The VNA 200 measures and stores a ratio of a transmission response over the reference signal, $A_{fFG\_termthru}/R1_{fFG\_termthru}$. The ratio is used in the transmission tracking error coefficient equation where:

$$\tau_{FG} = (A_{fFG\_termthru}/R1_{fFG\_termthru})(1 Sx_{22\_portF}\Gamma_{portF}) \quad (38)$$

The reverse transmission tracking error coefficient for the same proximal pair, ports F&G, where both measurement ports 103 of the proximal pair are capable of connection to the first test channel 111 is measured and calculated by keeping the connection of the thru 601 between the measurement ports 103 of the proximal pair, connecting the signal generator 105 to the second one of the measurement ports 103 of the proximal pair and terminating the sampling arm 113 in a local terminating impedance 116. The first one of the measurement ports 103 of the proximal pair is terminated in the local terminating impedance 104, and the respective sampling arm 113 is connected to the first test channel 111. The VNA 200 measures and stores a ratio of a transmission response over the reference signal, $A_{rFG\_termthru}/R1_{rFG\_termthru}$. The ratio is used in the transmission tracking error coefficient equation where:

$$\tau = (A_{rFG\_termthru}/R1_{rFG\_termthru})(1 - Sx_{22\_portG}\Gamma_{portG}) \quad (39)$$

Figure 20:
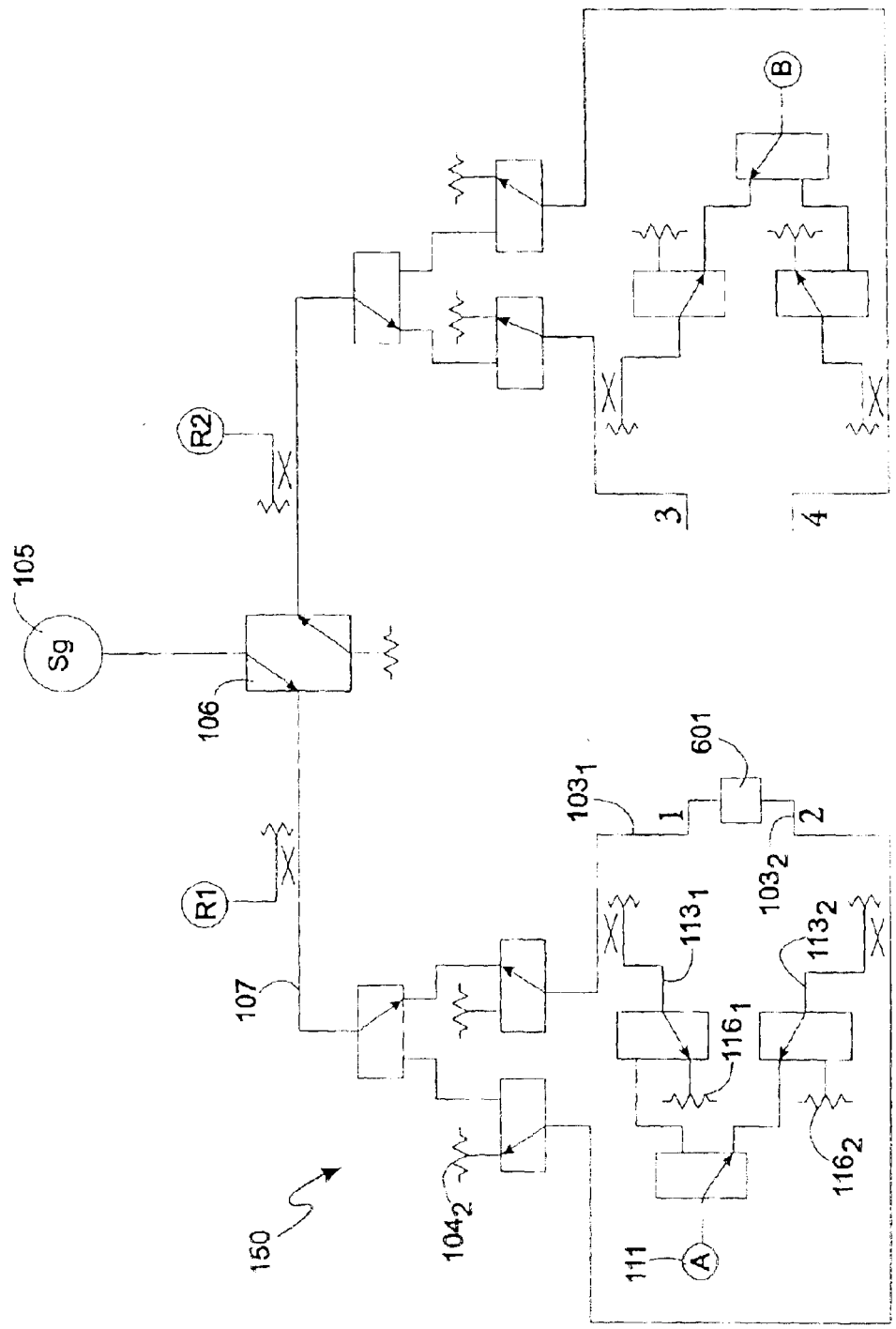
FIGS. 20 and 21 show steps for measuring proximal pairs of measurement ports in an embodiment of a method according to the present teachings.

For purposes of illustration and with specific reference to FIG. 20, there is shown connection diagrams for the determination of the forward and reverse transmission tracking error coefficients for the proximal pair comprising measurement ports $103_1$ and $103_2$. The forward transmission measurement is made by connecting the signal generator 105 to the first signal path 107. The switch network 150 is configured so that the first signal path 107 is connected to the measurement port $103_1$ and the respective sampling arm $113_1$ is terminated in the local sampling arm impedance $116_1$. The switch network 150 is further configured so that the measurement port $103_2$ is terminated in the local terminating impedance $104_2$ and the sampling arm $113_2$ is connected to the first test channel 111. The signal generator 105 sweeps through the plurality of frequencies that define the desired frequency range and measures the ratio $A_{f12\_termthru}/R1_{f12\_termthru}$. Using equation (37) the forward transmission tracking error coefficient for the proximal pair is calculated as:

$$\Gamma_{12} = (A_{f12\_termthru}/R1_{f12\_termthru})(1 - SX_{22\_port1}\Gamma_{port1})$$

The thru 601 connection and the signal transfer switch 106 configuration are maintained. With specific reference to FIG. 21 of the drawings, the switch network 150 is reconfigured so that the measurement port $103_2$ is connected to the first signal path 107 and the respective sampling arm $113_2$ is terminated in the local sampling terminating impedance $116_2$. Additionally, the switch network 150 is configured so that the measurement port $103_1$ is terminated in the local terminating impedance $104_1$ and the sampling arm $113_1$ is connected to the first test channel 111. The signal generator 105 sweeps through the plurality of frequencies that define the desired frequency range and measures the ratio $A_{r12\_termthru}/R1_{r12\_termthru}$. Using equation (38) the reverse transmission tracking error coefficient for the proximal pair is calculated as:

$$\tau_{21} = (A_{r12\_termthru}/R1_{r12\_termthru})(1 - SX_{22\_port2}\Gamma_{port2})$$

The same measurement and calculation process is repeated for the remaining proximal pairs, which in the illustrated embodiment is the proximal pair comprising measurement ports $103_3$ and $103_4$. As one of ordinary skill in the art appreciates, the measurements for the proximal pair capable of connection to the second test channel 112 are carried out using the same process, but with the second test channel 112 and the second reference channel 202 as measurement devices. In a multiport embodiment, the measurement and calculation process is repeated for all of the proximal pairs.

With specific reference to FIGS. 22 through 26 of the drawings, there is shown a flow chart of a method according to the teachings of the present invention in which a reflect standard 301 is connected 2201 to one port of a first direct pair and the switch network 150 is configured for measurement 2202 by the VNA 200 of a ratio of the reflection response over the stimulus. See FIG. 3 of the drawings. The ratio yields a value for a number of frequencies in a desired frequency range. The numbers are stored in a data array where each element of the data array holds the measured ratio at a single frequency. The reflect 301 is then disconnected and reconnected 2203 to the other port in the direct pair, the switch network 150 is reconfigured, and the other port in the direct pair is stimulated and the ratio of the reflection response over the stimulus is measured and stored 2204 in another data array. See FIG. 4 of the drawings. In a preferred embodiment, the desired frequency range for which all measurements are taken is the same. In this case, each element in the data arrays represents measured results at the same frequency point along the desired frequency range.

The flow chart continues with step of connecting 2301 and configuring 2302 the switch network 150 for measurement of the line 401 between ports of the same direct pair. The VNA 200 measures 2302 a forward direction reflection and transmission response at the measurement ports 103 of the direct pair at the first and second test channels 111, 112 as well as the first and second reference channels 201, 202. The switch network 150 is then reconfigured 2303 for the reverse direction measurement and the VNA 200 then measures 2303 a reverse direction reflection and transmission response at the measurement ports 103 of the direct pair at the first and second test channels 111, 112 as well as the first and second reference channels 201, 202. Not shown in the flow chart is the connection and measurement of the matched loads 501 as shown in FIG. 6 of the drawings to extend the calibration to the lower frequency range.

Figure 23:
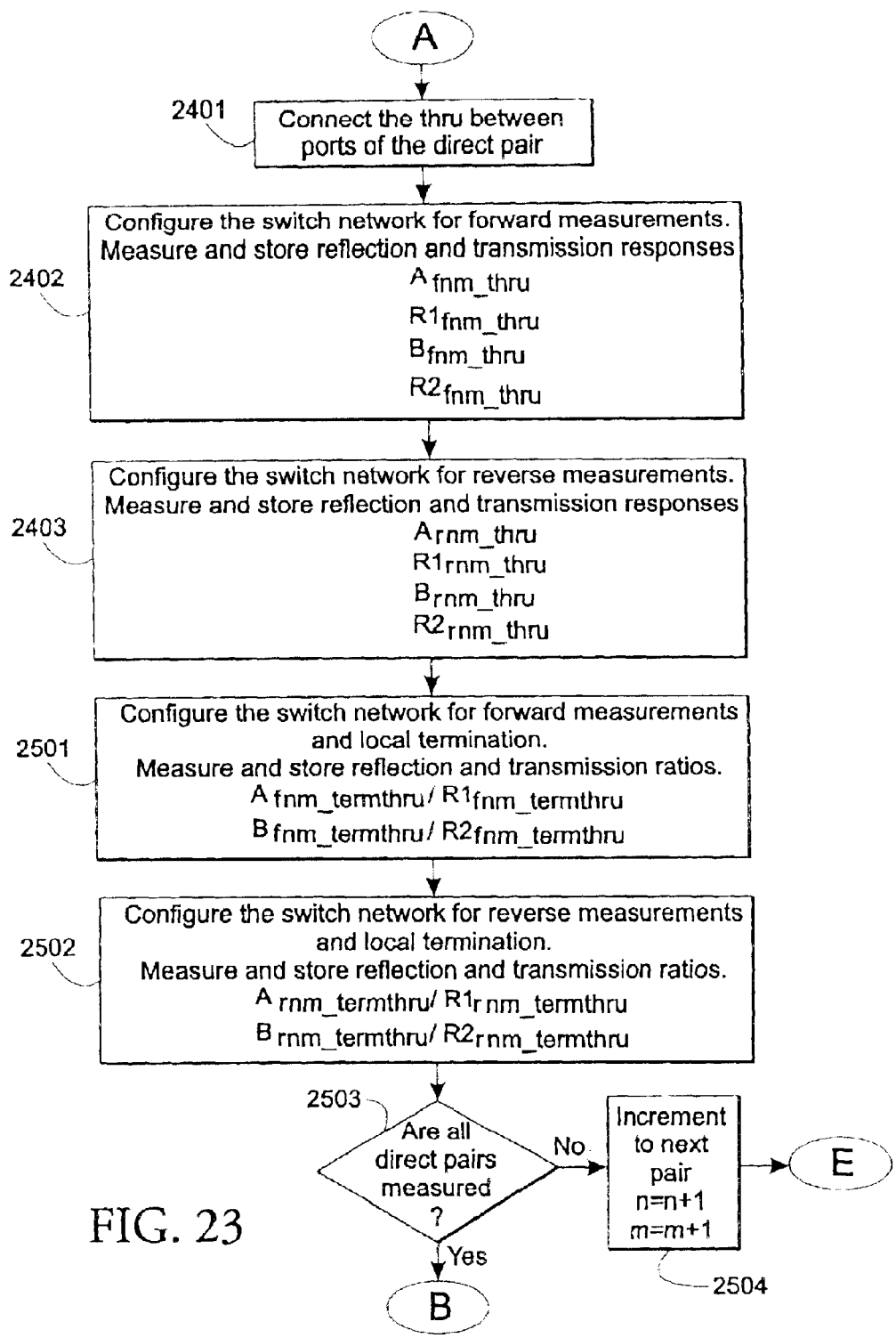

With specific reference to FIGS. 23, 7, and 8 of the drawings, the flow chart continues with the step of connecting 2401 the thru 601 to the measurement ports 103 of the same direct pair. The switch network 150 is configured 2402 for forward direction measurement of the thru 601, and the forward direction reflection and transmission responses and the reference channel signals are measured and stored in data arrays. The switch network 150 is then reconfigured 2403 for the reverse direction measurements and the reverse direction reflection and transmission responses and the reference channel signals are measured and stored in data arrays.

With specific reference to FIGS. 23 and 9 of the drawings, the thru 601 remains connected and the switch network 150 is reconfigured 2501 for a forward direction measurement, where the thru 601 is locally terminated in a local impedance 104 within the switch network 150. The forward direction reflection and transmission responses of the locally terminated thru 601 are measured and stored as well as the reference channel signals. The switch network 150 is then reconfigured 2502 for a reverse direction measurement of the locally terminated thru 601, the reverse reflection and transmission responses and the reference channel signals are measured and stored. The process repeats 2503 for all direct pairs of measurement ports. The indices n and m as shown in the flow chart represent that the process increments through all of the direct pairs. As one of ordinary skill in the art appreciates, the direct pairs may be defined in another way than is illustrated herein in which case, the step of incrementing through the direct pairs as shown by reference numeral 2504 uses a different convention. After incrementing to the next direct pair, the process steps repeat (See connector E in FIG. 22 of the drawings) until all direct pairs are measured. See FIGS. 10 through 16 for an illustrative representation of the measurements made on the second direct pair.

Figure 24:
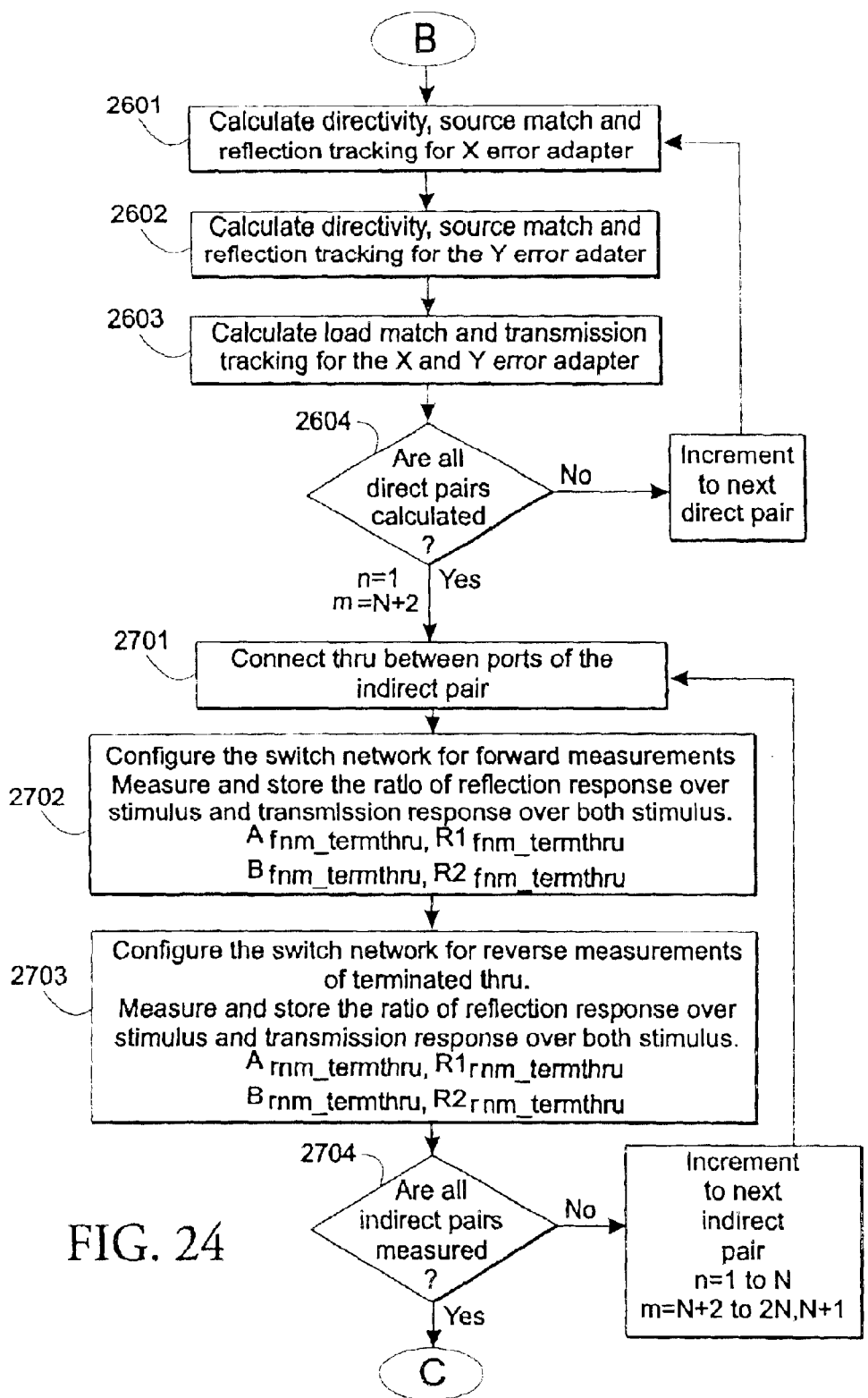

With specific reference to FIGS. 24 and 19 of the drawings, the directivity 1901, source match 1902 and reflection tracking 1903 error coefficients for the X error adapter 1910 are calculated 2601 from the stored data arrays. The directivity 1904, source match 1905 and reflection tracking 1906 error coefficients for the Y error adapter 1920 are also calculated 2602 from the stored data arrays. Using the results of the calculations, the load match and transmission tracking error coefficients are then calculated for both the X and Y error adapters. The calculation process is repeated 2604 for all direct pairs.

With specific reference to FIGS. 24, 17, and 18, the thru 601 is connected 2701 between the measurement ports 103 of the first indirect pair. The switch network 150 is configured 2702 for a forward direction measurement with the thru 601 locally terminated in the switch network 150. The forward reflection and transmission responses and the first and second reference channels are measured. The measured results are stored in additional data arrays. The switch network 150 is reconfigured 2703 for a reverse direction measurement with the thru 601 locally terminated in the switch network 150. The reverse reflection and transmission responses and the first and second reference channels are measured. The measured results are stored in data arrays. This process is repeated 2704 for all indirect pairs. As one of ordinary skill in the art appreciates, the indirect pairs may be defined in many different ways. The flow chart illustrates one method where the measurement port 103 capable of connection to the first test channel 111 is incremented from 1 to N−1 and while the measurement port 103 capable of connection to the second test channel 112 is incremented from N+2 to 2N. The last indirect pair is between measurement ports 103 N and N+1. Other methods depending upon the definition of the measurement ports 103 that make up the indirect pairs differ from the one illustrated herein.

Figure 25:
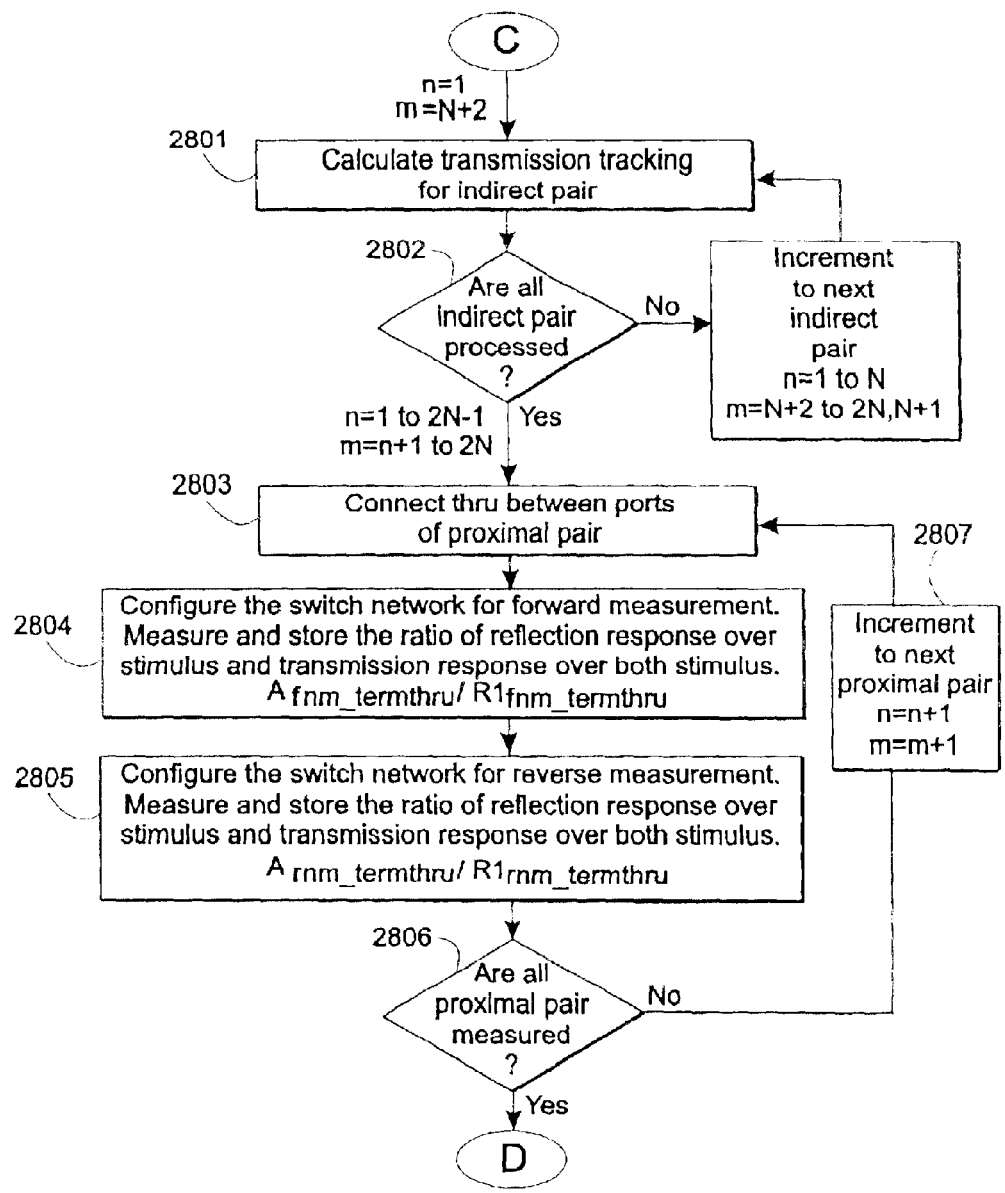

With specific reference to FIG. 25 of the drawings, the flow chart continues with the steps of calculating 2801 a transmission tracking coefficient for each indirect pair. The process increments 2802 through all of the indirect pairs in the same way as for the measurement portion of the indirect pairs.

Figure 21:
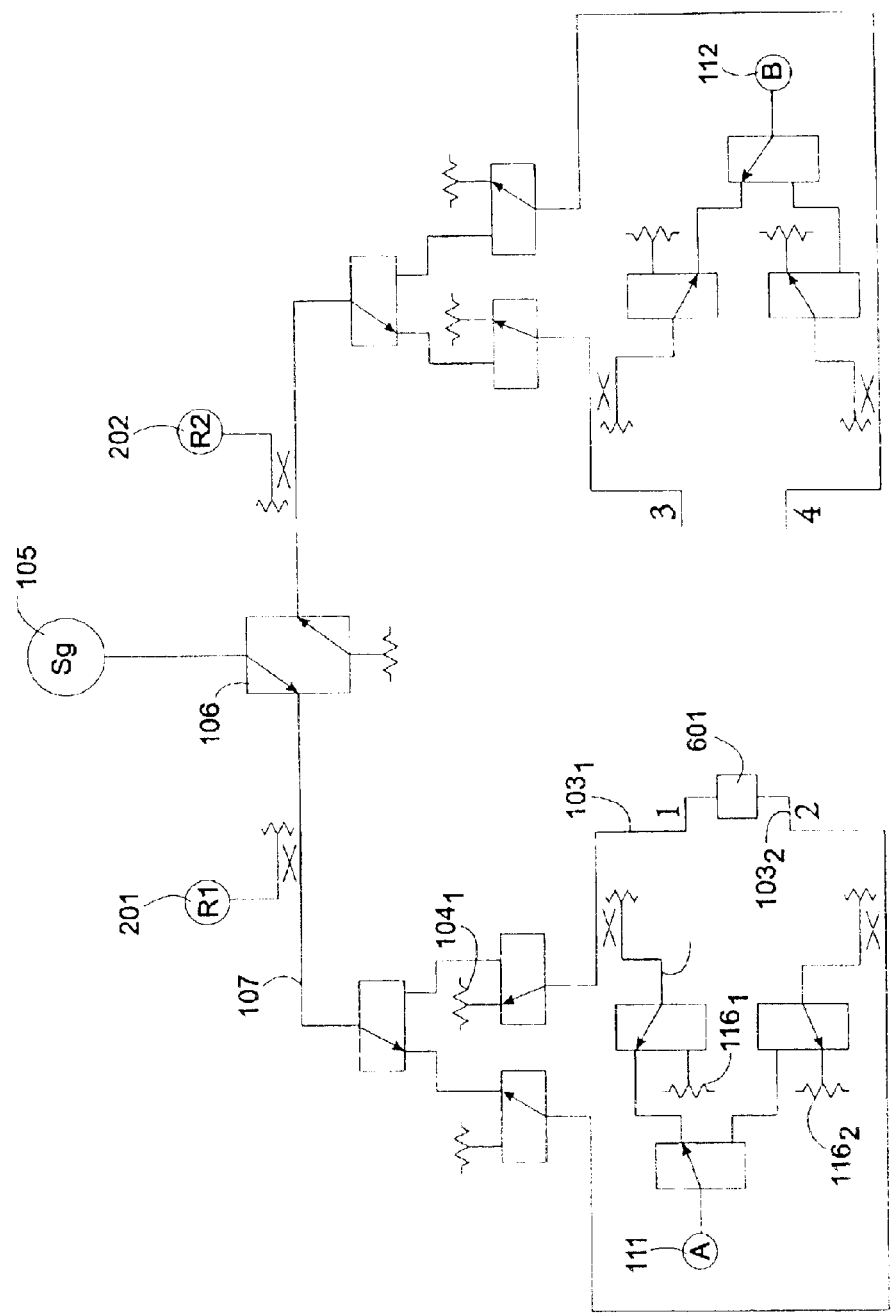
Figure 22:
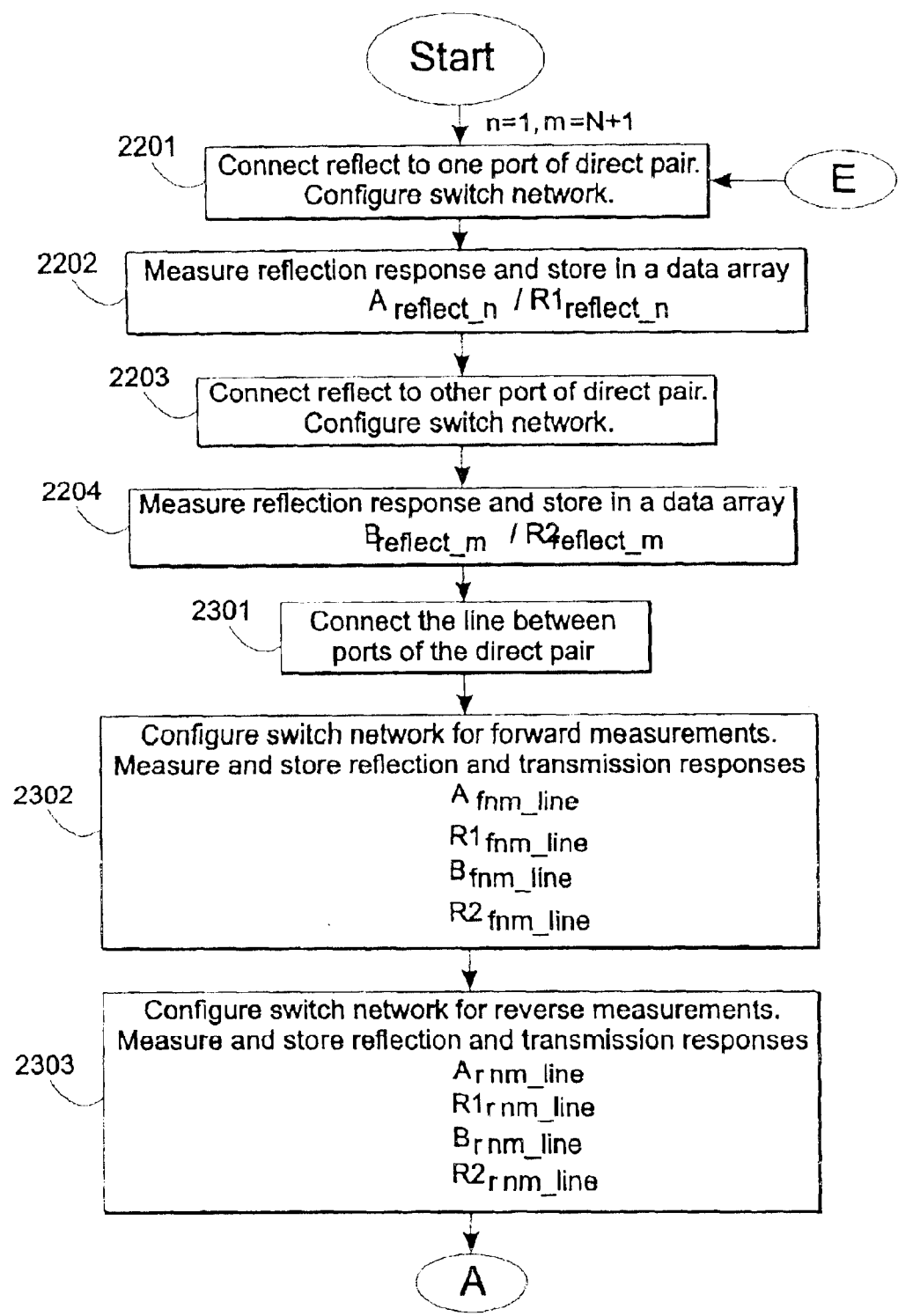
FIGS. 22 through 26 illustrate a flow chart of an embodiment of a method according to the present teachings.

With specific reference to FIGS. 25, 20, and 21, the process then continues with the steps of connecting the thru 601 between the measurement ports 103 that comprise proximal pairs. In the illustrated embodiment, the proximal pairs are the measurement ports 103 that are adjacent to each other. The thru 601 is connected 2803 between a first proximal pair as shown in FIG. 20 and the switch network 150 is configured 2804 for a forward direction measurement of the thru 601 in a locally terminated condition. See FIG. 20 of the drawings. A ratio of the forward transmission response over the stimulus as measured by the first reference channel is measured and stored 2804 in a data array. The switch network 150 is reconfigured 2805 for a reverse direction measurement. See FIG. 21 of the drawings. A ratio of the reverse transmission response over the stimulus as measured by the first reference channel is measured and stored 2805 in a data array. The steps for the proximal pairs are repeated 2806 for each proximal pair. As one of ordinary skill in the art appreciates, the method of incrementing the measurement ports 103 in the loop 2806 for repetition of the process for each proximal pair begins with measurement ports $103_n$ and $103_m$ where n=1 and m=n+1. Both n and m are incremented through the process, although there is one condition where n and m actually define an indirect pair. In that case, the process steps are not performed.

Figure 26:
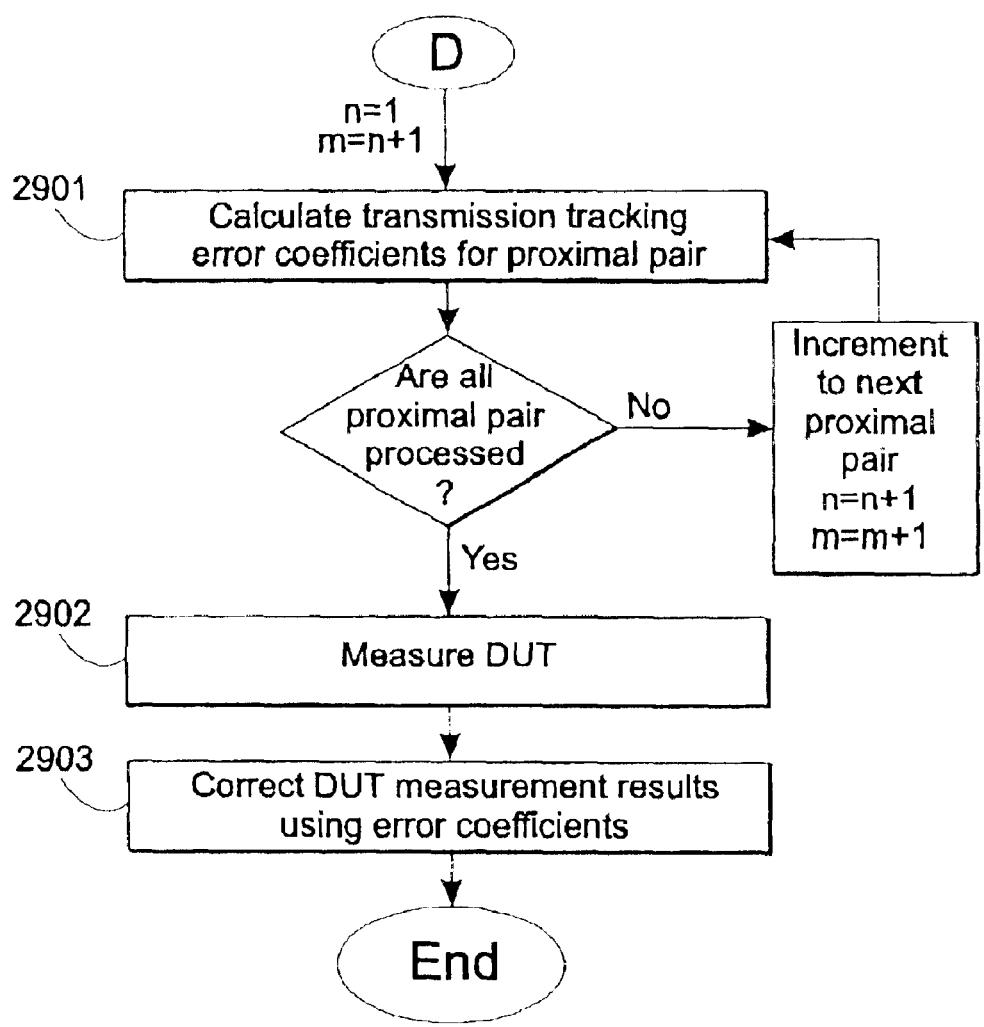

With specific reference to FIG. 26 of the drawings, the flow chart continues with the steps of calculating 2901 the transmission tracking error coefficients for each one of the proximal pairs.

When all of the systematic error coefficients are determined, the DUT 101 is inserted for measurement 2902. The measured DUT data is then corrected 2903 according to the teachings of the '040 Patent Application by using all of the systematic error coefficients calculated as taught herein. Advantageously, a method and apparatus according to the teachings herein provides an improved characterization of the error artifacts present in measurements made of the DUT 101 with the VNA 200. This provides for a more accurate characterization of the frequency response of the DUT 101 as distinct from the frequency response contributions of the error artifacts that are part of the measurement system.

What is claimed is:

1. A method of calibrating a measurement path comprising the steps of:

providing a vector network analyzer having at least two reference receivers, and a total of 2N measurement ports, wherein N is an integer, presenting a high reflect calibration standard and measuring a reflection characteristic for each said measurement port, presenting a line calibration standard between N direct pairs of said measurement ports and measuring forward and reverse reflection and transmission characteristics for each one of said N direct pairs of said measurement ports, presenting a through calibration standard between said N direct pairs of said measurement ports and measuring forward and reverse reflection and transmission characteristics for each one of said N direct pairs of said measurement ports, calculating directivity, source match, load match and reflection tracking error coefficients for each one of said measurement ports, and presenting only said through calibration standard between indirect pairs of said measurement ports, measuring forward and reverse reflection and transmission characteristics, and calculating the forward and reverse transmission tracking error coefficients for each said indirect pair of measurement ports.

2. A method of calibrating as recited in claim 1 and further comprising the steps of presenting said through calibration standard between no more than N−1 indirect pairs of said measurement ports.

3. A method of calibrating as recited in claim 2 and further comprising the steps of calculating forward transmission tracking and reverse transmission tracking error coefficients for each one of said N direct pairs and N−1 indirect pairs of said measurement ports.

4. A method of calibrating as recited in claim 3 and further comprising the steps of:
   connecting only said through calibration standard between proximal pairs of said measurement ports,
   measuring reflection and transmission responses of said proximal pairs when said through calibration standard is connected therebetween, and
   calculating forward and reverse transmission tracking error coefficients for each one of said proximal pairs.

5. A method of measuring comprising the method of calibrating as recited in claim 3 and further comprising the steps of measuring a 2N port device, and correcting a result of said step of measuring using said directivity, source match, reflection tracking, load match, forward transmission tracking, and reverse transmission tracking error coefficients.

6. A method of calibrating as recited in claim 1 wherein said high reflect standard is a short circuit.

7. A method of calibrating as recited in claim 1 wherein said high reflect standard is an open circuit.

8. A method of calibrating as recited in claim 1 wherein said line calibration standard is a first calibration standard having a first frequency range and further comprising the steps of presenting to each measurement port of said N direct pairs of said measurement ports a second calibration standard having a second frequency range and measuring forward and reverse reflection and transmission characteristics for each one of said N direct pairs of said measurement ports thereby extending a frequency range of said calibration method.

9. A method of calibrating as recited in claim 1 and further comprising the steps of presenting to each measurement port of said N direct pairs of said measurement ports two matched loads and measuring forward and reverse reflection characteristics for each one of said N direct pairs of said measurement ports thereby extending a frequency range of said calibration method to lower frequencies.

10. A method of calibrating as recited in claim 1 and further comprising the step of correcting said forward and reverse reflection and transmission characteristics from said step of measuring said line calibration standard and said step of measuring said through calibration standard for said N direct pairs of said measurement ports for effects of a transfer switch before said steps of calculating directivity, source match, and reflection tracking for each one of said measurement ports.

11. A method of calibrating as recited in claim 10 wherein said step of correcting uses the formulation:

$$S_{corrected} = \begin{bmatrix} \left\{ \dfrac{\dfrac{A_f}{R1_f} - \dfrac{A_r}{R2_r}\dfrac{R2_f}{R1_f}}{1 - \dfrac{R2_f}{R1_f}\dfrac{R1_r}{R2_r}} \right\} & \left\{ \dfrac{\dfrac{A_r}{R2_r} - \dfrac{A_f}{R1_f}\dfrac{R1_r}{R2_r}}{1 - \dfrac{R2_f}{R1_f}\dfrac{R1_r}{R2_r}} \right\} \\ \left\{ \dfrac{\dfrac{B_f}{R1_f} - \dfrac{B_r}{R2_r}\dfrac{R2_f}{R1_f}}{1 - \dfrac{R2_f}{R1_f}\dfrac{R1_r}{R2_r}} \right\} & \left\{ \dfrac{\dfrac{B_r}{R2_r} - \dfrac{B_f}{R1_f}\dfrac{R1_r}{R2_r}}{1 - \dfrac{R2_f}{R1_f}\dfrac{R1_r}{R2_r}} \right\} \end{bmatrix}$$

where $A_f$, $A_r$, $B_f$, $B_r$, $R1_f$, $R1_r$, $R2_f$, $R2_r$, are measurements taken by a first test channel in a forward direction, said first test channel in a reverse direction, a second test channel in a forward direction, said second test channel in a reverse direction, a first reference channel in a forward direction, said first reference channel in a reverse direction, a second reference channel in a forward direction, and said second reference channel in a reverse direction, respectively.

12. An apparatus for calibrating a measurement path comprising:
   a vector network analyzer having at least two reference receivers, two test channels, and a total of 2N measurement ports, wherein N is an integer,
   means for measuring and storing high reflect characteristics for each said measurement port when a high reflect calibration standard is connected thereto, line forward and reverse reflection and transmission characteristics for each one of N direct pairs of said measurement ports when a line calibration standard is connected therebetween, direct through forward and reverse reflection and transmission characteristics for each one of said N direct pairs of said measurement ports when a through calibration standard is connected therebetween, and indirect through forward and reverse reflection and transmission characteristics for indirect pairs of said measurement ports only when said through calibration standard is connected therebetween,
   means for calculating directivity, source match, reflection tracking for each one of said direct pairs of said measurement ports and
   means for calculating the forward and reverse transmission tracking error coefficients for each said indirect pair of measurement ports.

13. An apparatus for calibrating as recited in claim 12 and further comprising means for measuring forward and reverse reflection and transmission characteristics, and calculating a load match error coefficient for each measurement port.

14. An apparatus for calibrating as recited in claim 13 and further comprising means for calculating forward transmission tracking and reverse transmission tracking for N−1 indirect pairs and each one of said N direct pairs of said measurement ports.

15. An apparatus for calibrating as recited in claim 13 wherein said means for measuring further comprises a means for measuring reflection and transmission responses of proximal pairs of said measurement ports for only a through calibration standard connected therebetween and said means for calculating further comprises a means for calculating forward and reverse transmission tracking error coefficients for each one of said proximal pairs.

16. An apparatus for measuring comprising the apparatus for calibrating as recited in claim 14 and wherein said means for measuring further comprises means for measuring a 2N port device to obtain DUT measurements, and said apparatus further comprises a means for correcting said DUT measurements using said directivity, source match, reflection tracking, load match, forward transmission tracking, and reverse transmission tracking error coefficients.

17. An apparatus for calibrating as recited in claim 12 and further comprising means for measuring a 2N port device resulting in a raw measurement of said 2N port device and a means for correcting said raw measurement using said directivity, source match, reflection tracking, load match, forward transmission tracking, and reverse transmission tracking values.

18. An apparatus for calibrating as recited in claim 12 said high reflect standard further comprising a short circuit calibration standard.

19. An apparatus for calibrating as recited in claim 12 said high reflect standard further comprising an open circuit calibration standard.

20. An apparatus for calibrating as recited in claim 12 wherein said line calibration standard is a first calibration standard having a first frequency range and further comprising the steps of presenting to each measurement port of said N direct pairs of said measurement ports a second calibration standard having a second frequency range and measuring forward and reverse reflection and transmission characteristics for each one of said N direct pairs of said measurement ports thereby extending a frequency range of said calibration method.

21. An apparatus for calibrating as recited in claim 12 said means for measuring and storing further comprising means for measuring and storing matched load forward and reverse reflection and transmission characteristics for each one of said N direct pairs of said measurement ports thereby extending a frequency range of said calibration method to lower frequencies.

22. An apparatus for calibrating as recited in claim 12, wherein said step of measuring and storing results in raw line forward and reverse reflection and transmission characteristics and raw through forward and reverse reflection and transmission characteristics and further comprising means for correcting said raw line forward and reverse reflection and transmission characteristics and said raw through forward and reverse reflection and transmission characteristics for said N direct pairs of said measurement ports for effects of a transfer switch.

23. An apparatus for calibrating as recited in claim 22 wherein said step of correcting uses the formulation:

$$S_{corrected} = \begin{bmatrix} \left\{ \dfrac{\left(\dfrac{A_f}{R1_f} - \dfrac{A_r}{R2_r}\dfrac{R2_f}{R1_f}\right)}{1 - \dfrac{R2_f}{R1_f}\dfrac{R1_r}{R2_r}} \right\} & \left\{ \dfrac{\left(\dfrac{A_r}{R2_r} - \dfrac{A_f}{R1_f}\dfrac{R1_r}{R2_r}\right)}{1 - \dfrac{R2_f}{R1_f}\dfrac{R1_r}{R2_r}} \right\} \\ \left\{ \dfrac{\left(\dfrac{B_f}{R1_f} - \dfrac{B_r}{R2_r}\dfrac{R2_f}{R1_f}\right)}{1 - \dfrac{R2_f}{R1_f}\dfrac{R1_r}{R2_r}} \right\} & \left\{ \dfrac{\left(\dfrac{B_r}{R2_r} - \dfrac{B_f}{R1_f}\dfrac{R1_r}{R2_r}\right)}{1 - \dfrac{R2_f}{R1_f}\dfrac{R1_r}{R2_r}} \right\} \end{bmatrix}$$

where $A_f$, $A_r$, $B_f$, $B_r$, $R1_f$, $R1_r$, $R2_f$, $R2_r$, are measurements taken by a first test channel in a forward direction, said first test channel in a reverse direction, a second test channel in a forward direction, said second test channel in a reverse direction, a first reference channel in a forward direction, said first reference channel in a reverse direction, a second reference channel in a forward direction, and said second reference channel in a reverse direction, respectively.

* * * * *